US012587213B2

(12) United States Patent
Luo et al.

(10) Patent No.: US 12,587,213 B2
(45) Date of Patent: Mar. 24, 2026

(54) METHOD AND SYSTEM OF ERROR INJECTION FOR LOW-DENSITY PARITY-CHECK

(71) Applicant: Yangtze Memory Technologies Co., Ltd., Wuhan (CN)

(72) Inventors: Wen Luo, Wuhan (CN); Yufei Feng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 144 days.

(21) Appl. No.: 17/938,557

(22) Filed: Oct. 6, 2022

(65) Prior Publication Data

US 2024/0120946 A1 Apr. 11, 2024

(51) Int. Cl.
*H03M 13/00* (2006.01)
*H03M 13/11* (2006.01)

(52) U.S. Cl.
CPC ...... *H03M 13/1174* (2013.01); *H03M 13/611* (2013.01)

(58) Field of Classification Search
None
See application file for complete search history.

(56) References Cited

U.S. PATENT DOCUMENTS 8,832,525 B2 * 9/2014 Yang .................. H03M 13/1111
714/755
9,432,053 B1 * 8/2016 Graumann ......... H03M 13/1128
(Continued)

FOREIGN PATENT DOCUMENTS

CN 111863088 A 10/2020
CN 112506443 A 3/2021
CN 113227959 A 8/2021

OTHER PUBLICATIONS

Sandell et al., "Machine Learning for LLR Estimation in Flash Memory With LDPC Codes," IEEE Transactions on Circuits and Systems—II: Express Briefs, vol. 68, No. 2, 792-796, Aug. 17, 2020, 5 pages.

(Continued)

*Primary Examiner* — Mujtaba M Chaudry
(74) *Attorney, Agent, or Firm* — Conley Rose, P.C.

(57) ABSTRACT

A method for verifying a low-density parity-check (LDPC) unit capable of being applied in a memory system can include receiving original data corresponding to a memory device, encoding the original data by the LDPC unit to be verified, injecting errors into the encoded original data by a data pattern for generating verifying data, and verifying a soft decode capability of the LDPC unit by utilizing the verifying data. The data pattern can include the errors generated by threshold voltage ($V_{th}$) distributions interlaced between two neighboring logic states of $2^n$ logic states of the memory device. The method and system can provide an error injection to accurately and efficiently verify a LDPC soft decode capability of the LDPC unit, decrease errors, increase error correction accuracy and efficiency, more accurately model actual threshold voltage ($V_{th}$) distributions, increase flexibility, increase speed, increase performance, and reduce firmware overhead.

19 Claims, 13 Drawing Sheets

(56) References Cited

U.S. PATENT DOCUMENTS

| | | | | |
|---|---|---|---|---|
| 9,647,697 | B2 * | 5/2017 | Chen | G11C 29/028 |
| 2012/0096234 | A1 * | 4/2012 | Jiang | G11C 13/0069 |
| | | | | 711/170 |
| 2013/0297986 | A1 * | 11/2013 | Cohen | G06F 3/061 |
| | | | | 714/763 |
| 2013/0326302 | A1 * | 12/2013 | Han | H03M 13/451 |
| | | | | 714/752 |
| 2014/0281762 | A1 * | 9/2014 | Norrie | H03M 13/3905 |
| | | | | 714/703 |
| 2015/0280906 | A1 * | 10/2015 | Shany | H04L 9/004 |
| | | | | 380/29 |
| 2016/0274969 | A1 * | 9/2016 | Chen | H03M 13/1111 |
| 2017/0149446 | A1 * | 5/2017 | Tao | H03M 13/1142 |
| 2018/0269906 | A1 * | 9/2018 | Haah | H03M 13/033 |
| 2021/0042652 | A1 * | 2/2021 | Das | H03M 13/1575 |
| 2021/0281501 | A1 * | 9/2021 | Mahadevan | G06F 30/20 |
| 2023/0420006 | A1 * | 12/2023 | Linnen | G11C 11/54 |

OTHER PUBLICATIONS

He et al., "Artificial Neural Network Assisted Error Correction for MLC NAND Flash Memory," Micromachines 2021, vol. 12, 879, Jul. 27, 2021, 12 pages.

ATP Electronics, "What is Error detection correction, LDPC, BCH, Reed-Solomon Algorithm?," Memory & Storage Technologies: Explaining ECC and LDPC algorithm for SSD, Jun. 6, 2019, 5 pages.

Cai et al., "Threshold Voltage Distribution in MLC NAND Flash Memory: Characterization, Analysis, and Modeling," IEEE Proceedings of the Conference on Design, Automation and Test in Europe (DATE), 1285-1290, Mar. 18, 2013, 6 pages.

Jeon et al., "LDPC Codes for Memory Systems with Scrubbing," 2010 IEEE Global Telecommunications Conference (GLOBECOM 2010), Dec. 6, 2010, 6 pages.

Zhao et al., "LDPC-in-SSD: Making Advanced Error Correction Codes Work Effectively in Solid State Drives," 11th USENIX Conference on File and Storage Technologies (FAST '13), 243-256, Feb. 12, 2013, 14 pages.

Zuolo et al., "Fully Integrated LLR Calculation Flow," Flash Memory Summit 2018, Presentation, 17 pages.

Balatsoukas-Stimming et al., "LLR-Based Successive Cancellation List Decoding of Polar Codes," IEEE Transactions on Signal Processing, vol. 63, No. 19, 5165-5179, Oct. 1, 2015, 15 pages.

Cho et al., "Quantitative Evaluation of Soft Error Injection Techniques for Robust System Design," 2013 50th ACM/EDAC/IEEE Design Automation Conference (DAC), May 29, 2013, 10 pages.

Spilla et al., "Run-time Soft Error Injection and Testing of a Microprocessor using FPGAs," Proceedings of the Workshop Testmethoden und ZuverlAssigkeit von Schaltungen und Systemen (TUZ), Passau, Germany, Feb. 2011, 6 pages.

Armelin et al., "Soft-Error Vulnerability Estimation Approach Based on the SET Susceptibility of Each Gate," Electronics 2019, vol. 8, 749, Jul. 2, 2019, 18 pages.

* cited by examiner

1200

| RECEIVING BINARY DATA | 1202 |

| GENERATING THRESHOLD VOLTAGE ($V_{th}$) VALUES FOR CORRESPONDING PROGRAM STATES OF THE BINARY DATA | 1204 |

| GENERATING SOFT DATA BASED ON THE GENERATED THRESHOLD VOLTAGE ($V_{th}$) AND PRESET THRESHOLD VOLTAGE ($V_{th}$) OFFSETS | 1206 |

| COMPARING THE SOFT DATA TO THE BINARY DATA | 1208 |

| VERIFYING AN ERROR CORRECTION CAPABILITY OF AN LDPC UNIT | 1210 |

METHOD AND SYSTEM OF ERROR INJECTION FOR LOW-DENSITY PARITY-CHECK

BACKGROUND

Field

The present disclosure relates to memory apparatuses, systems, and methods, for example, low-density parity-check (LDPC) soft-decision decode apparatuses, systems, and methods.

Background

Flash memory (flash) is a non-volatile memory that uses charge stored on a charge storage layer to represent information. Flash stores each bit (e.g., 0 or 1) in a memory cell that includes a transistor with a charge storage layer. Memory device architectures can provide ultra-high density storage. However, noise in memory devices increases as memory device size decreases, which can contribute to a higher raw bit error rate (RBER). Further, RBER increases with each program and erase (P/E) cycle and there can be variability between different flash pages.

SUMMARY

Embodiments of the disclosed technology relate to an error injection method to accurately and to efficiently verify LDPC soft decode error correction capabilities in non-volatile memory devices.

In some aspects, a method for verifying a low-density parity-check (LDPC) unit capable of being applied in a memory system can include receiving original data corresponding to a memory device, provided in the memory system, in which each memory cell is configured to store n-bit of data, wherein n is a whole number larger than 1. In some aspects, the method can further include encoding the original data by the LDPC unit to be verified. In some aspects, the method can further include injecting errors into the encoded original data, by a data pattern including the errors generated by threshold voltage ($V_{th}$) distributions interlaced between two neighboring logic states of $2^n$ logic states of the memory device, for generating verifying data. In some aspects, the method can further include verifying a soft decode capability of the LDPC unit by utilizing the verifying data.

In some aspects, the data pattern is obtained from real data information of the memory device. In some aspects, the real data information can include error information of the memory device under different test environments. In some aspects, the real data information can include error information of the memory device when storage operation is actually performed.

In some aspects, the error information can include read-out data errors of the memory device due to overlapping threshold voltage ($V_{th}$) distributions of neighboring (adjacent) logic states in different test environments. In some aspects, the different test environments can include different temperatures, different erase times, or a combination thereof. In some aspects, the error information can include read-out data errors of the memory device due to overlapping threshold voltage ($V_{th}$) distributions of neighboring (adjacent) logic states when actually performing storage operations (e.g., write).

In some aspects, the real data information can include the actual threshold voltage ($V_{th}$) corresponding to the memory cell where each data is located. In some aspects, the real data information can include an address of the memory cell, the stored data, the corresponding threshold voltage ($V_{th}$), or a combination thereof. In some aspects, the real data information can be used to obtain the threshold voltage ($V_{th}$) distribution of memory cells of the memory device in different logic states.

In some aspects, the data pattern can include threshold voltage ($V_{th}$) distribution information of a plurality of memory cells of the memory device at different logic states.

In some aspects, the data pattern can include threshold voltage ($V_{th}$) distribution information of a plurality of memory cells of a single page of the memory device at different logic states.

In some aspects, injecting errors into the encoded original data can include assigning a threshold voltage ($V_{th}$) to the encoded original data according to the data pattern for generating the verifying data.

In some aspects, according to the logic state corresponding to each memory cell when the encoded original data is stored in the memory device, assigning a corresponding threshold voltage ($V_{th}$) to each memory cell can be based on a threshold voltage ($V_{th}$) distribution law for each logic state in the data pattern. In some aspects, a threshold voltage ($V_{th}$) can be randomly assigned to each memory cell in a particular logic state under the condition that the threshold voltage ($V_{th}$) distribution law of that particular logic state is satisfied. In some aspects, the threshold voltage ($V_{th}$) distribution law can include a threshold voltage ($V_{th}$) distribution of a particular logic state that satisfies a statistical distribution (e.g., probability percentage).

In some aspects, verifying the soft decode capability of the LDPC unit by utilizing the verifying data can include generating soft read data by stimulating a soft read of the verifying data according to a soft read rule matching to the LDPC unit to be verified. In some aspects, verifying the soft decode capability of the LDPC unit by utilizing the verifying data can include performing, based on the soft read data, soft decoding using the LDPC unit to be verified.

In some aspects, the soft read rule matching to the LDPC unit to be verified can include a setting rule of a read level offset. In some aspects, according to the soft read rule of the LDPC unit to be verified, a plurality of read voltages can be set and the assigned threshold voltages ($V_{th}$) can be used as threshold voltages ($V_{th}$) of each memory cell to stimulate a read operation of the memory device. In some aspects, the soft read data can include a plurality of read voltage and the corresponding read-out data.

In some aspects, the method can further include verifying a soft decode error correction capability of the LDPC unit based on the decoded soft data and the original data.

In some aspects, verifying the soft decode capability of the LDPC unit by utilizing the verifying data can include generating, based on the verifying data, soft data according to preset threshold voltage ($V_{th}$) offsets. In some aspects, verifying the soft decode capability of the LDPC unit by utilizing the verifying data can include decoding the soft data with the LDPC unit. In some aspects, verifying the soft decode capability of the LDPC unit by utilizing the verifying data can include verifying whether the LDPC unit returns the encoded original data for each corresponding decoded soft data.

In some aspects, the method can further include writing the encoded original data into a memory cache of the memory device. In some aspects, the method can further include reading the encoded original data stored in the memory cache. In some aspects, the method can further include writing the soft data into the memory cache of the memory device.

In some aspects, a system for verifying a low-density parity-check (LDPC) soft decode capability can include a memory system and a host coupled to the memory system. In some aspects, the memory system can include a memory device and a memory controller in which an LDPC unit to be verified is provided. In some aspects, the system can be configured to receive original data corresponding to the memory device in which each memory cell is configured to store n-bit of data, wherein n is a whole number larger than 1. In some aspects, the system can be further configured to encode the original data by use of the LDPC unit. In some aspects, the system can be further configured to inject errors into the encoded original data, by use of a data pattern including the errors generated by threshold voltage ($V_{th}$) distributions interlaced between two neighboring logic states of $2^n$ logic states of the memory device, for generating verifying data. In some aspects, the system can be further configured to verify a soft decode capability of the LDPC unit by utilizing the verifying data.

In some aspects, the system can be further configured to assign a threshold voltage ($V_{th}$) to the encoded original data according to the data pattern for generating the verifying data.

In some aspects, the system can be further configured to generate soft read data by stimulating a soft read of the verifying data according to a soft read rule matching to the LDPC unit to be verified. In some aspects, the system can be further configured to perform, based on the soft read data, soft decoding using the LDPC unit to be verified.

In some aspects, the system can be further configured to verify a soft decode error correction capability of the LDPC unit based on the decoded soft data and the original data.

In some aspects, the system can be further configured to generate, based on the verifying data, soft data according to preset threshold voltage ($V_{th}$) offsets. In some aspects, the system can be further configured to decode the soft data with the LDPC unit. In some aspects, the system can be further configured to verify whether the LDPC unit returns the encoded original data for each corresponding decoded soft data.

In some aspects, the system can be further configured to write the encoded original data into a memory cache of the memory device. In some aspects, the system can be further configured to read the encoded original data stored in the memory cache. In some aspects, the system can be further configured to write the soft data into the memory cache of the memory device.

In some aspects, a memory system can include a memory controller and a memory device coupled to the memory controller. In some aspects, the memory controller can include an LDPC unit to be verified. In some aspects, the memory device can include a memory cache. In some aspects, the memory system can be configured to receive original data corresponding to the memory device in which each memory cell is configured to store n-bit of data, wherein n is a whole number larger than 1. In some aspects, the memory system can be further configured to encode the original data by use of the LDPC unit. In some aspects, the memory system can be further configured to inject errors into the encoded original data, by use of a data pattern including the errors generated by threshold voltage ($V_{th}$) distributions interlaced between two neighboring logic states of $2^n$ logic states of the memory device, for generating verifying data. In some aspects, the memory system can be further configured to verify a soft decode capability of the LDPC unit by utilizing the verifying data.

In some aspects, the memory system can be further configured to generate, based on the verifying data, soft data according to preset threshold voltage ($V_{th}$) offsets. In some aspects, the memory controller can be configured to decode the soft data with the LDPC unit. In some aspects, the memory controller can be further configured to verify whether the LDPC unit returns the encoded original data for each corresponding decoded soft data. In some aspects, the memory device can be configured to store soft data into the memory cache.

In some aspects, a method for soft decode verification in a memory system can include reading binary data. In some aspects, the method can include reading binary data from a host. In some aspects, the method can further include generating threshold voltage ($V_{th}$) values for corresponding logic states of the binary data. In some aspects, the method can further include converting the generated threshold voltage ($V_{th}$) values to soft data. In some aspects, the method can further include comparing the soft data to the binary data.

In some aspects, the method can further include correcting errors in the binary data based on the comparison of the soft data to the binary data. In some aspects, the method can further include creating corrected binary data based on the comparison of the soft data to the binary data. In some aspects, the method can further include writing the corrected binary data to a memory device of the memory system.

In some aspects, the generating threshold voltage ($V_{th}$) values can include mapping the binary data to a pattern. In some aspects, the mapping the binary data can include determining a threshold voltage ($V_{th}$) probability distribution for each logic state of the binary data based on the pattern. In some aspects, the mapping the binary data can further include calculating a logic state for each bit line of the binary data. In some aspects, the mapping the binary data can further include assigning a threshold voltage ($V_{th}$) value for each bit line logic state of the binary data based on the threshold voltage ($V_{th}$) probability distribution.

In some aspects, the mapping the binary data can include randomly mapping the binary data to the pattern. In some aspects, the randomly mapping the binary data can include selecting a percentage of binary data based on a statistical probability of a corresponding threshold voltage ($V_{th}$) value and a read level granularity of the memory system.

In some aspects, the mapping the binary data can include generating the pattern from big data of the memory system. In some aspects, the generating the pattern can include statistically measuring threshold voltage ($V_{th}$) probability distributions of each corresponding logic state of the binary data. In some aspects, the statistically measuring threshold voltage ($V_{th}$) probability distributions can include compiling threshold voltage ($V_{th}$) values for each logic state for at least 1,000 similarly manufactured memory devices.

In some aspects, a method for soft decode verification in a memory system can include (a) reading user data. In some aspects, the method can include reading user data from a host device. In some aspects, the method can further include (b) encoding the user data with a low-density parity-check (LDPC) unit. In some aspects, the method can further include (c) writing the encoded user data to a memory cache of the memory system. In some aspects, the method can further include (d) reading raw user data from the memory cache. In some aspects, the method can further include (e) mapping the raw user data to a pattern. In some aspects, the method can further include (f) generating threshold voltage ($V_{th}$) data for the raw user data based on the pattern mapping. In some aspects, the method can further include (g) generating soft data based on the threshold voltage ($V_{th}$) data and preset threshold voltage ($V_{th}$) offsets. In some aspects, the method can further include (h) writing the soft data to the memory cache. In some aspects, the method can further include (i) decoding the soft data with the LDPC unit. In some aspects, the method can further include (j) verifying whether the LDPC unit returns the encoded user data for each corresponding decoded soft data.

In some aspects, the method can further include repeating steps (g) through (i) for each threshold voltage ($V_{th}$) value.

In some aspects, the reading user data can include reading a logic state of each bit line of the user data.

In some aspects, the mapping the raw user data can include generating the pattern from big data of the memory system.

In some aspects, the mapping the raw user data can include randomly mapping the raw user data to the pattern. In some aspects, the randomly mapping the raw user data can include assigning a threshold voltage ($V_{th}$) value for each bit line logic state of the raw user data based on a corresponding threshold voltage ($V_{th}$) probability distribution. In some aspects, the assigning the threshold voltage ($V_{th}$) value can include utilizing the same amount of bits of the raw user data as that used to randomly calculate the corresponding threshold voltage ($V_{th}$) probability distribution.

In some aspects, the generating soft data can include sorting x variable nodes of the threshold voltage ($V_{th}$) data to y constraint nodes of the preset threshold voltage ($V_{th}$) offsets. In some aspects, the sorting can include sorting five bit line bin intervals of the threshold voltage ($V_{th}$) data relative to three preset threshold voltage ($V_{th}$) offsets.

In some aspects, the method can further include determining a LDPC soft decode verification capability of the memory system. In some aspects, the method can further include determining a LDPC soft decode verification capability of the LDPC unit.

In some aspects, a system for soft decode verification in a memory system can include a memory array, a controller, a soft decoder, and a low-density parity-check (LDPC) unit. In some aspects, the memory array can include a memory cache configured to store binary data. In some aspects, the memory cache can be configured to store binary data from a host. In some aspects, the controller can be coupled to the memory array and be configured to generate threshold voltage ($V_{th}$) values for corresponding logic states of the binary data based on a pattern. In some aspects, the soft decoder can be coupled to the controller and be configured to convert the threshold voltage ($V_{th}$) values to soft data. In some aspects, the LDPC unit can be coupled to the memory array and the soft decoder. In some aspects, the LDPC unit can be configured to encode the binary data to the memory cache. In some aspects, the LDPC unit can be further configured to decode the soft data from the memory cache. In some aspects, the controller can be configured to compare the encoded binary data to the decoded soft data.

In some aspects, the pattern can be based on big data of the memory array. In some aspects, the big data can include statistical threshold voltage ($V_{th}$) probability distributions of each corresponding logic state. In some aspects, the statistical threshold voltage ($V_{th}$) probability distributions can be based on at least 1,000 similarly manufactured memory arrays.

In some aspects, the statistical threshold voltage ($V_{th}$) probability distributions can be based on a read level granularity of the memory system.

In some aspects, the controller can be further configured to randomly map the binary data to corresponding threshold voltage ($V_{th}$) values based on the pattern.

In some aspects, the controller can be further configured to determine a LDPC soft decode verification capability of the LDPC unit.

In some aspects, the binary data can include at least three pages in the memory array. In some aspects, the memory array can include triple-level cells (TLC). In some aspects, the memory system can include a three-dimensional (3D) NAND device.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
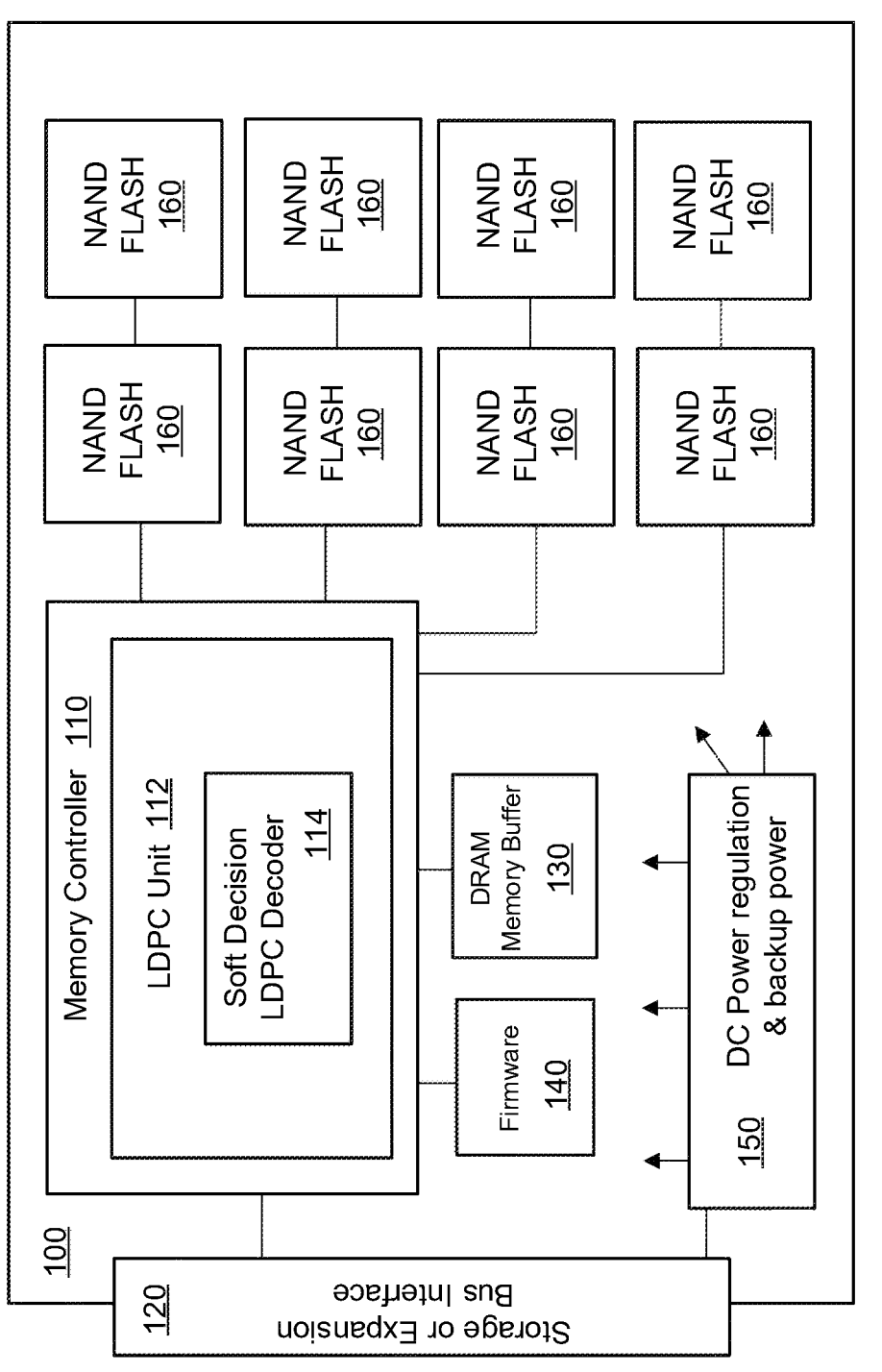
FIG. 1 is a schematic illustration of a memory system with a memory controller for error correction, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "fail bit count" or "FBC" as used herein indicates the number of failed or defective bits in a memory array. The FBC indicates the number of memory cells with an error (e.g., 0 instead of 1). The FBC can be extrapolated to an error rate for a word line and a block by taking multiple measurements of different pages and word lines.

The term "logic state" or "LS" as used herein indicates a unit of information that can be represented by a voltage value and/or a voltage distribution (e.g., a threshold voltage ($V_{th}$) distribution). Each logic state can include one or more bits (e.g., 0 or 1) to represent unit(s) of information. For example, a triple-level cell (TLC) can store three bits per cell and includes one erase state (e.g., L0=[111]) and seven logic states (e.g., L1=[011], L2=[001], L3=[000], L4=[010], L5= [110], L6=[100], L7=[101]).

The term "error" or "bit flip" as used herein indicates an unintentional logic state switch (e.g., 0 to 1 or 1 to 0) of a bit stored in a memory array. Errors are inherent to memory (e.g., NAND) storage and can be caused by, but not limited to, (a) alpha particles from memory package decay, (b) cosmic rays creating energetic neutrons and/or protons, (c) thermal neutrons, or (d) random noise or signal integrity issues (e.g., inductive coupling, capacitive coupling, cross-talk, etc.).

The term "error correcting code" or "ECC" as used herein indicates codes that add redundant data or parity data to a message such that the message can be recovered by a receiver even when a number of errors are introduced, either during the process of transmission or storage. In general, the ECC can correct the errors up to the capability of the code being used.

The term "low-density parity-check" or "LDPC" as used herein indicates a form of error correcting code (ECC) to minimize errors. LDPC is a linear ECC that can be used to correct the raw bit error rate (RBER) of a memory device, e.g., a NAND flash device. LDPC can include two modes: hard-decision decoding and soft-decision decoding.

The term "soft data" as used herein indicates the readout information obtained from multiple read voltage levels ($V_{read}$).

The term "big data" as used herein indicates one or more large data sets than can be analyzed (e.g., computationally, statistically, etc.) to reveal patterns, trends, and/or associations. For example, threshold voltage ($V_{th}$) values for corresponding logic states of a plurality of memory devices (e.g., more than 1,000 chips under similar manufacturing conditions) can be analyzed statistically to determine a threshold voltage ($V_{th}$) probability distribution for each logic state (e.g., 8% probability that L1 state has $V_{th}$=1.2 V).

The term "similarly manufactured" as used herein indicates memory devices having a comparable, near-identical, or identical design that were manufactured or fabricated under comparable, near-identical, or identical manufacturing conditions (e.g., material, thickness, timing, dose, temperature, etc.), for example, semiconductor device fabrication processes (e.g., NAND flash devices). For example, more than 1,000 TLC 3D NAND devices can be similarly manufactured using substantially the same process conditions for substantially uniform output and functionality across the fabricated devices.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; NAND flash devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary Memory System with Memory Controller

FIG. 1 illustrates memory system 100 with memory controller 110 for LDPC verification, according to various exemplary aspects. Memory system 100 can be configured to utilize an error injection method (e.g., LDPC soft decode verification method 500) for verifying an LDPC unit of memory system 100, for example, verifying a soft decode capability of the LDPC unit. Memory system 100 can be further configured to verify a soft decode capability of an LDPC unit by encoding original data, injecting errors into the encoded original data to generate verifying data, generating soft data based on the verifying data, decoding the soft data with the LDPC unit, and verifying the soft decode capability of the LDPC unit by comparing the encoded original data to each corresponding decoded soft data. Memory system 100 can be further configured to utilize an error injection method (e.g., LDPC soft decode verification method 500) for error correction of memory system 100. Memory system 100 can be further configured to decrease errors (e.g., bit flips) and increase error correction efficiency in memory system 100.

Memory system 100 can be further configured to leverage statistical threshold voltage ($V_{th}$) probability distributions (e.g., big data) for corresponding logic states to more accurately model actual (real) threshold voltage ($V_{th}$) distributions of data written on memory system 100 (e.g., pattern 700). Memory system 100 can be further configured to utilize a random mapping process (e.g., mapping process 800) to flexibly and quickly map data written on memory system 100 (e.g., raw user data process 600) to a pattern (e.g., pattern 700) based on existing error data statistics (e.g., based on at least 1,000 chips manufactured under similar conditions) as a template to increase error correction accuracy and efficiency. In some aspects, memory system 100 can be further configured to utilize a host for data processing to increase performance of LDPC soft decode verification (e.g., LDPC soft decode verification method 500) and reduce firmware overhead. In some aspects, generating validation data and generating soft data (e.g., via simulation) can be done on a host, external test equipment, or on firmware of memory controller 110.

Although memory system 100 is shown in FIG. 1 as a stand-alone apparatus and/or system, the aspects of this disclosure can be used with other apparatuses, systems, and/or methods, such as, but not limited to, memory controller 110, storage or expansion bus interface 120, NAND flash memory devices 160, memory cache 162, binary threshold voltage ($V_{th}$) distribution 200, actual threshold voltage ($V_{th}$) distribution 300, threshold voltage ($V_{th}$) probability distribution process 400, LDPC soft decode verification method 500, soft decode process 560, raw user data process 600, pattern 700, mapping process 800, mapping flow diagram 900, threshold voltage ($V_{th}$) generation process 1000, soft data generation process 1100, flow diagram 1200, and/or flow diagram 1300. In some aspects, memory system 100 can be a general SSD storage system product, including a controller and one or more memory devices (e.g., NAND flash memory devices). In some aspects, memory system 100 can be any type of memory system (e.g., SSD, UFS, eMMC, etc.). In some aspects, memory system 100 can utilize a selected pattern (e.g., pattern 700)

to generate validation data. In some aspects, the selected pattern (e.g., pattern 700) may be different for different types of memory devices and/or different environments (e.g., temperature conditions).

As shown in FIG. 1, memory system 100 can include memory controller 110, storage or expansion bus interface 120, memory buffer 130 (e.g., DRAM), firmware 140, DC power regulation circuitry 150, and NAND flash memory devices 160. Memory controller 110 can be configured to provide error correction for memory system 100 (e.g., provide error correcting code (ECC)). Memory controller 110 can be further configured to utilize an error injection method (e.g., LDPC soft decode verification method 500) to accurately and efficiently determine LDPC soft decode error correction capabilities of memory system 100 (e.g., error correction capabilities of LDPC unit 112). Memory controller 110 can be further configured to implement LDPC verification, for example, verify a capability of the LDPC code itself. In some aspects, LDPC verification can be implemented on a host or external test equipment (e.g., verify a capability of the LDPC code itself). Memory controller 110 can be further configured to decrease errors (e.g., bit flips) and increase error correction efficiency in memory system 100. Memory controller 110 can be further configured to generate threshold voltage ($V_{th}$) values for corresponding logic states (e.g., L0-L7) of binary data based on a pattern (e.g., pattern 700).

Memory controller 110 can be further configured to leverage statistical threshold voltage ($V_{th}$) probability distributions (e.g., big data) for corresponding logic states to more accurately model actual (real) threshold voltage ($V_{th}$) distributions of data (e.g., with pattern 700), for example, for data written on memory system 100. Memory controller 110 can be further configured to utilize a random mapping process (e.g., mapping process 800) to flexibly and quickly map data written on memory system 100 (e.g., raw user data process 600) to a pattern (e.g., pattern 700) based on existing error data statistics (e.g., based on at least 1,000 chips manufactured under similar conditions) as a template to increase error correction accuracy and efficiency. In some aspects, memory controller 110 can be further configured to utilize a host for data processing to increase performance of LDPC soft decode verification (e.g., LDPC soft decode verification method 500) and reduce firmware overhead.

Figure 5:
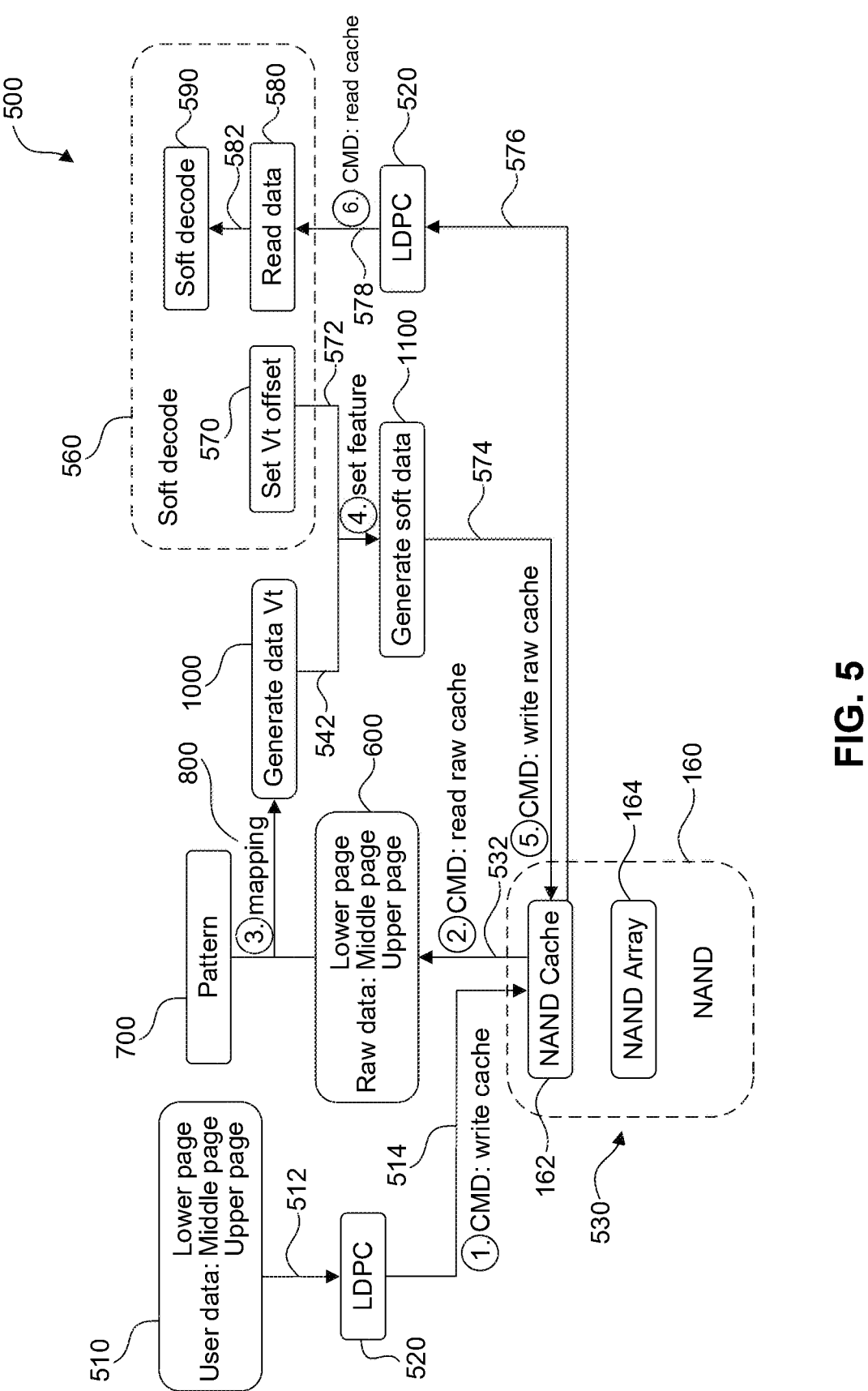
FIG. 5 is a schematic illustration of an LDPC soft decode verification method, according to an exemplary aspect.

Memory controller 110 can be coupled to storage or expansion bus interface 120, memory buffer 130 (e.g., DRAM), firmware 140, and NAND flash memory devices 160. In some aspects, memory controller 110 can provide a link between storage or expansion bus interface 120 (e.g., SATA, SCSI, SAS, PCIe or similar) and NAND flash memory devices 160. In some aspects, the number of NAND flash memory devices 160 may vary according to the storage capacity of the individual devices and memory system 100 as a whole. In some aspects, each NAND flash memory device 160 can include a memory cache and a memory array. For example, as shown in FIG. 5, NAND flash memory device 160 can include memory cache 162 and memory array 164.

In some aspects, memory controller 110 can include a storage unit configured to store a program code or other information. For example, as shown in FIG. 1, memory controller 110 can be coupled to memory buffer 130 and/or firmware 140 to store and/or retrieve a program code or other data (e.g., pattern 700, mapping process 800, preset threshold voltage ($V_{th}$) offset 570, etc.). In some aspects, firmware 140 can include software that provides the most basic and low-level control of memory system 100. In some aspects, firmware 140 can be held in memory controller 110. In some aspects, firmware 140 can be held in NAND flash memory devices 160. In some aspects, memory controller 110 can include a processing unit configured to implement a method or process. For example, as shown in FIG. 1, memory controller 110 can include LDPC unit 112 to implement a method or process (e.g., LDPC soft decode verification method 500, soft decode process 560, raw user data process 600, mapping process 800, mapping flow diagram 900, threshold voltage ($V_{th}$) generation process 1000, soft data generation process 1100, etc.). In some aspects, memory controller 110 can receive data from a host. For example, memory controller 110 can receive data (e.g., binary threshold voltage ($V_{th}$) distribution 200, raw user data process 600, etc.) from a host via expansion bus interface 120.

As shown in FIG. 1, memory controller 110 can include LDPC unit 112 with LDPC soft decoder 114. Memory controller 110 can be configured to control LDPC unit 112 and LDPC soft decoder 114 for error correction and verification of error correction capabilities. LDPC unit 112 can include an encryption (e.g., encoding) and error correcting block (e.g., error correction) coupled to soft-decision LDPC decoder 114.

LDPC unit 112 can be configured to encode binary data (e.g., user data 510) from memory controller 110. LDPC unit 112 can be further configured to decode soft data (e.g., via soft data generation process 1100) with LDPC soft decoder 114. LDPC unit 112 can be further configured to compare encoded binary data (e.g., user data 510) to decoded soft data (e.g., soft data generation process 1100), for example, to verify a LDPC soft decode error correction capability.

LDPC soft decoder 114 can be configured to generate soft data (e.g., via soft data generation process 1100) from threshold voltage ($V_{th}$) values. LDPC soft decoder 114 can be further configured to enact soft decode process 560. LDPC soft decoder 114 can be further configured to provide preset threshold voltage ($V_{th}$) offset 570 for soft data generation process 1100. LDPC soft decoder 114 can be further configured to read decoded soft data (e.g., soft data generation process 1100) from LDPC unit 112. In some aspects, threshold voltage ($V_{th}$) offset 570 can be set by LDPC soft decoder 114 according to the rules of the LDPC unit 112 to be verified. In some aspects, multiple read voltages ($V_{Read}$) can be generated according to threshold voltage ($V_{th}$) offset 570. In some aspects, memory controller 110 can generate multiple read voltages ($V_{Read}$), based on threshold voltage ($V_{th}$) offset 570 of LDPC soft decoder 114, to simulate a NAND read and, thus, generate soft data (e.g., soft data generation process 1100). In some aspects, LDPC unit 112 can perform soft decoding according to generated soft data. In some aspects, LDPC soft decoder 114 can be further configured to generate soft data (e.g., soft data generation process 1100). In some aspects, generated soft data for LDPC decoding can exist in any appropriate storage place, for example, in memory cache 162 or inside memory controller 110.

Exemplary Threshold Voltage ($V_{th}$) Distributions

Figure 2:
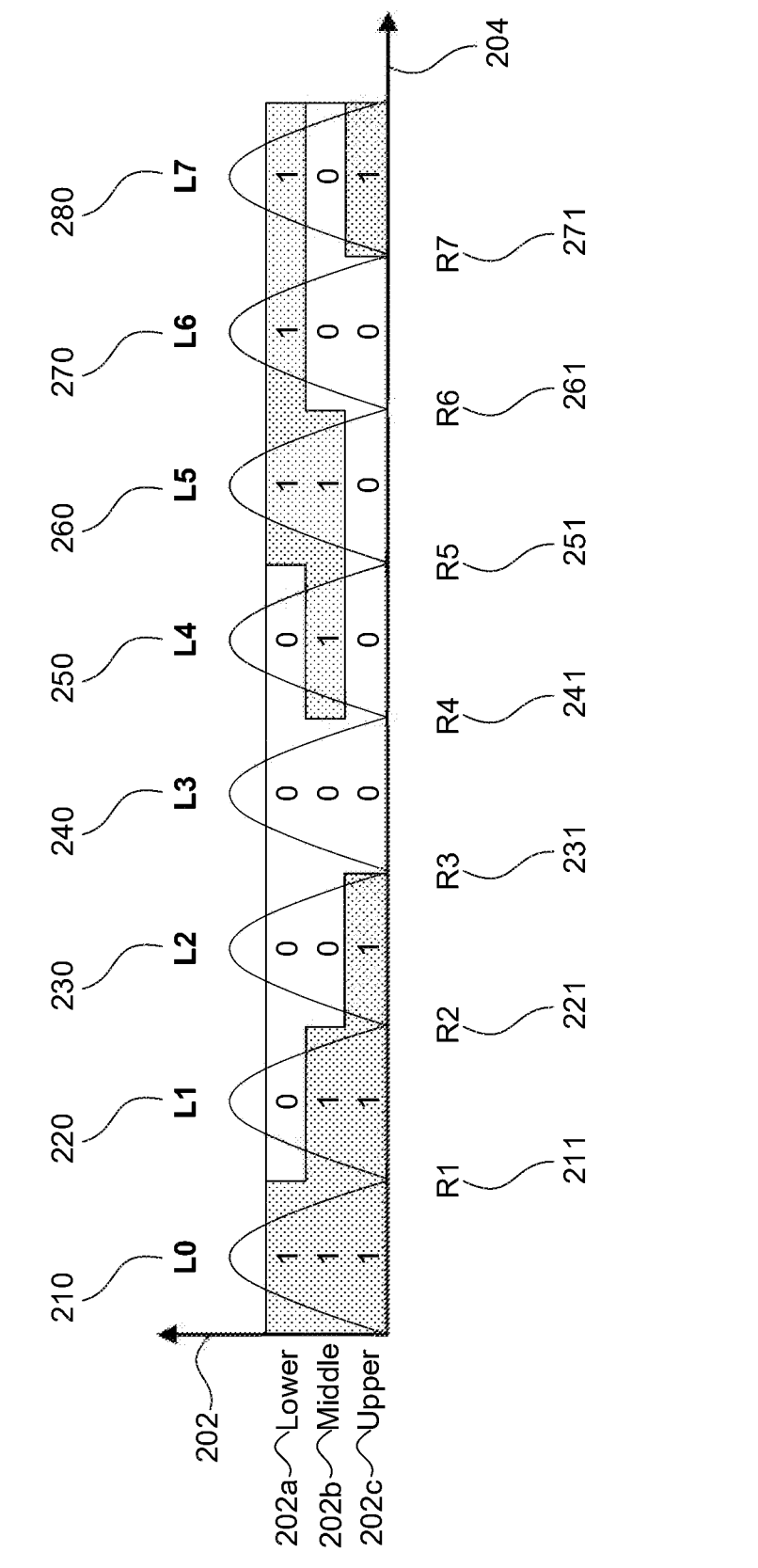
FIG. 2 is a schematic illustration of a binary (non-overlapping) threshold voltage ($V_{th}$) distribution for hard error injection, according to an exemplary aspect.
Figure 3:
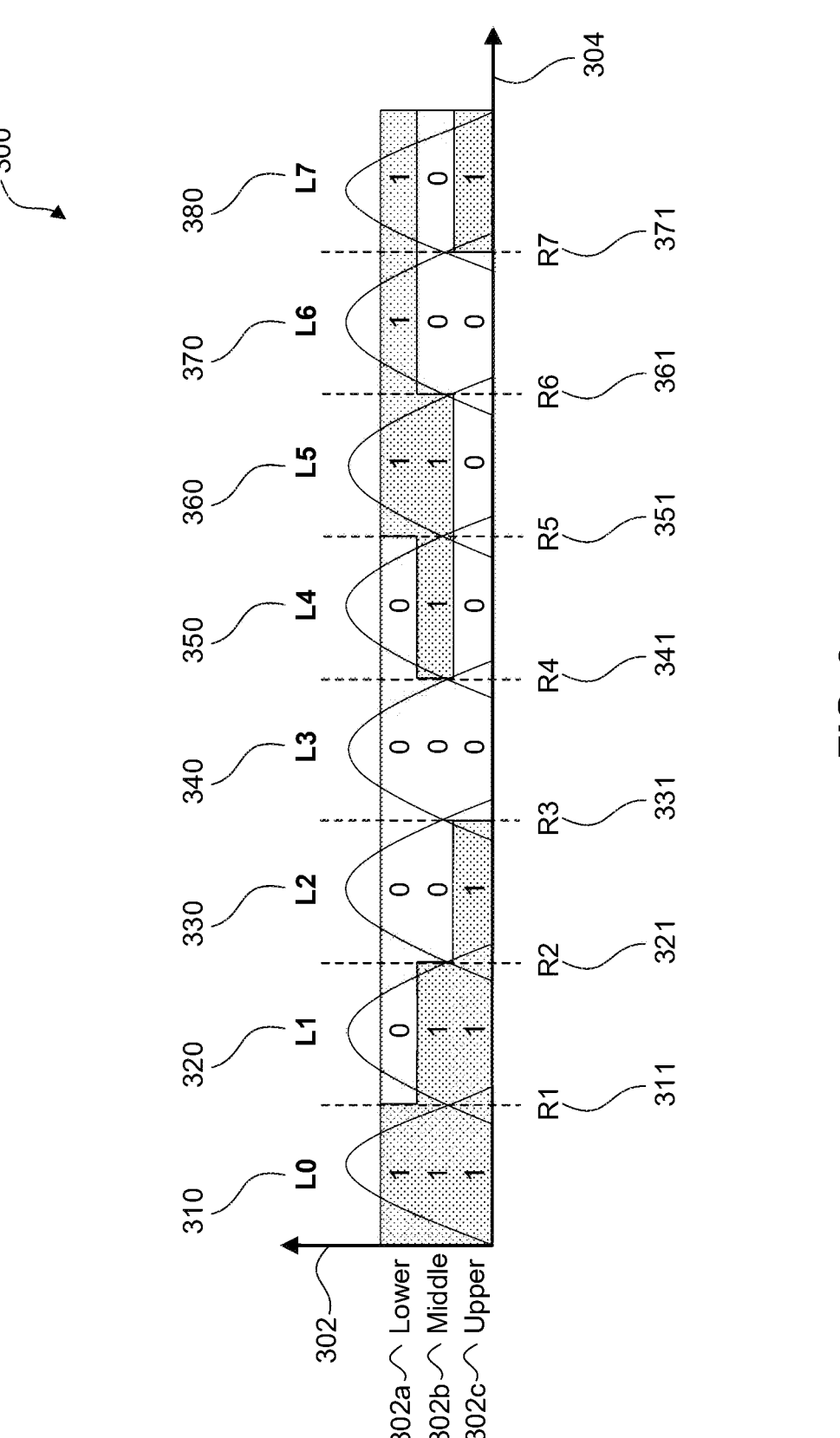
FIG. 3 is a schematic illustration of an actual (overlapping) threshold voltage ($V_{th}$) distribution for soft error injection, according to an exemplary aspect.
Figure 4:
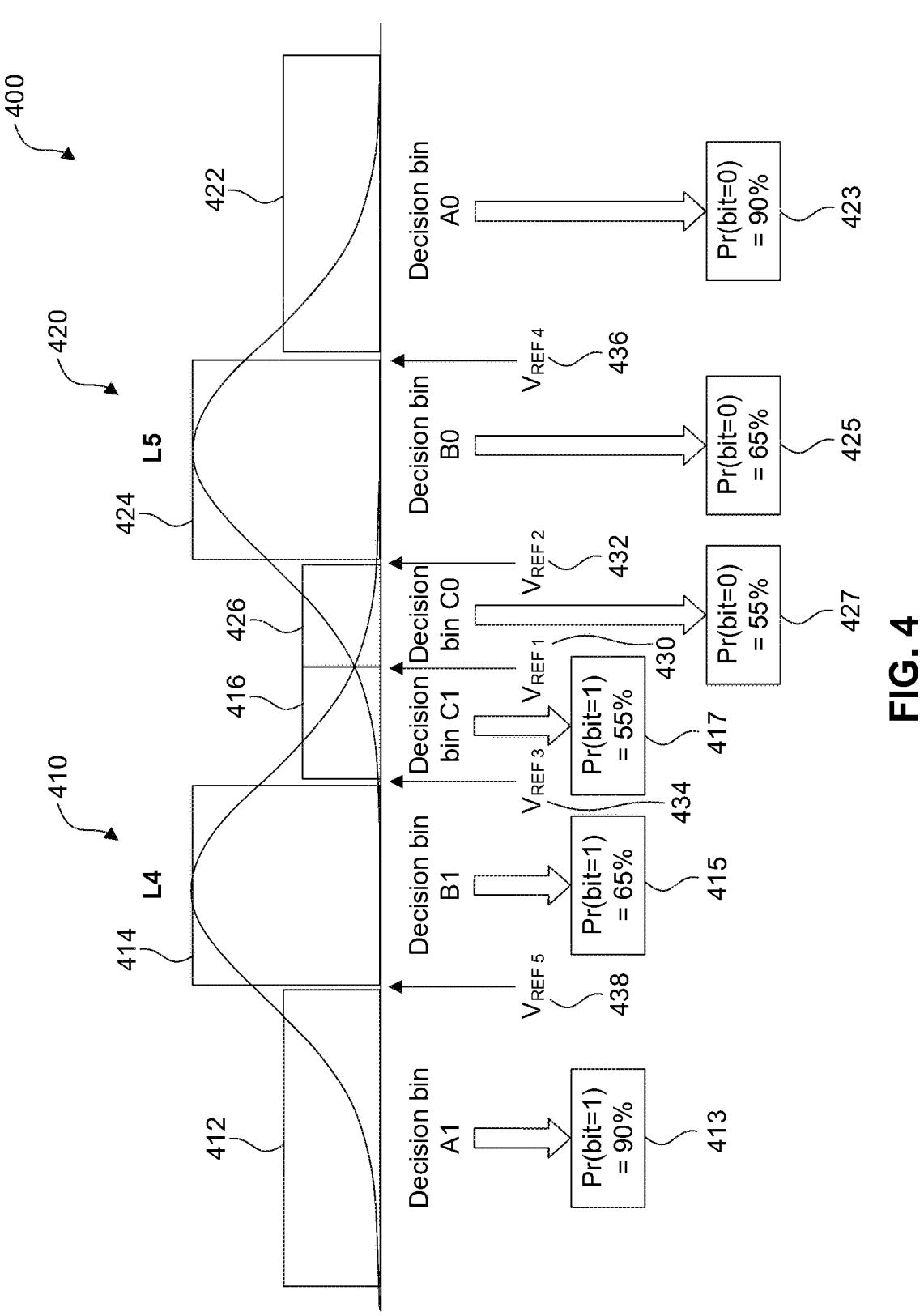
FIG. 4 is a schematic illustration of a threshold voltage ($V_{th}$) probability distribution process, according to an exemplary aspect.

FIGS. 2-4 illustrate threshold voltage ($V_{th}$) probability distribution processes 200, 300, 400, according to various exemplary aspects. FIG. 2 is a schematic illustration of binary (non-overlapping) threshold voltage ($V_{th}$) distribution 200, according to an exemplary aspect. Binary (non-overlapping) threshold voltage ($V_{th}$) distribution 200 is a regular distribution that can use hard decode error correction. FIG. 3 is a schematic illustration of actual (overlapping) threshold voltage ($V_{th}$) distribution 300, according to an exemplary aspect. Actual (overlapping) threshold voltage ($V_{th}$) distribution 300 is a distribution in which the threshold voltage ($V_{th}$) drift overlaps and soft decode error correction can be used. FIG. 4 is a schematic illustration of threshold voltage ($V_{th}$) probability distribution process 400, according to an exemplary aspect.

Although threshold voltage ($V_{th}$) probability distribution processes 200, 300, 400 are shown in FIGS. 2-4 as a stand-alone apparatus, system, and/or method, the aspects of these disclosures can be used with other apparatuses, systems, and/or methods, such as, but not limited to, memory controller 110, memory system 100, LDPC soft decode verification method 500, soft decode process 560, raw user data process 600, pattern 700, mapping process 800, mapping flow diagram 900, threshold voltage ($V_{th}$) generation process 1000, soft data generation process 1100, flow diagram 1200, and/or flow diagram 1300.

As shown in FIG. 2, binary (non-overlapping) threshold voltage ($V_{th}$) distribution 200 can include bit line (BL) count 202 (e.g., number of cells), read voltage 204 (e.g., storage cell $V_{th}$), logic states (L0-L7) 210, 220, 230, 240, 250, 260, 270, 280, and read levels (R1-R7) 211, 221, 231, 241, 251, 261, 271. Binary (non-overlapping) threshold voltage ($V_{th}$) distribution 200 can be utilized for hard error injection (e.g., definitive 0 or 1 state). Binary (non-overlapping) threshold voltage ($V_{th}$) distribution 200 can be utilized to read binary data (e.g., user data 510) from memory (e.g., NAND flash device 160). In some aspects, as shown in FIG. 2, BL count 202 (e.g., vertical axis) refers to the number of memory cells where the threshold voltage ($V_{th}$) (e.g., horizontal axis) corresponds to that value, and therefore reflects the distribution of the threshold voltage ($V_{th}$). In some aspects, as shown in FIG. 2, binary (non-overlapping) threshold voltage ($V_{th}$) distribution 200 can include lower page 202a, middle page 202b, and upper page 202c of binary data (e.g., three pages of a triple-level cell (TLC)), which reflects the relationship between the specific logic state (L0-L7) and the corresponding threshold voltage ($V_{th}$).

In some aspects, a binary (non-overlapping) threshold voltage ($V_{th}$) distribution can be used for a multi-level cell (MLC) (e.g., two bits per cell), a triple-level cell (TLC) (e.g., three bits per cell), a quad-level cell (QLC) (e.g., four bits per cell), or similar storage architectures. For example, as shown in FIG. 2, binary (non-overlapping) threshold voltage ($V_{th}$) distribution 200 corresponds to a TLC with three pages (e.g., lower page 202a, middle page 202b, upper page 202c). In some aspects, each memory cell of binary (non-overlapping) threshold voltage ($V_{th}$) distribution 200 is configured to store n-bit of data, where n is a whole number larger than 1. For example, n=2 corresponds to a multi-level cell (MLC) that stores two bits of data and has a total of four logic states ($2^2$). For example, as shown in FIG. 2, n=3 corresponds to a triple-level cell (TLC) that stores three bits of data (e.g., lower page 202a, middle page 202b, and upper page 202c) and has a total of eight logic states ($2^3$) (e.g., L0-L7). For example, n=4 corresponds to a quad-level cell (QLC) that stores four bits of data and has a total of sixteen logic states ($2^4$).

Logic states (L0-L7) 210, 220, 230, 240, 250, 260, 270, 280 can be configured to be binary (e.g., non-overlapping) and each can represent a target logic state (e.g., bit line information) of binary data (e.g., user data 510). In some aspects, memory system 100 can include NAND flash memory devices 160 (e.g., with memory cache 162) with triple-level cells (TLC) that can store three bits per cell. For example, as shown in FIG. 2, binary (non-overlapping) threshold voltage ($V_{th}$) distribution 200 can include one erase state (e.g., L0=[111] 210) and seven logic states (e.g., L1=[011] 220, L2=[001] 230, L3=[000] 240, L4=[010] 250, L5=[110] 260, L6=[100] 270, L7=[101] 280).

Read levels (R1-R7) 211, 221, 231, 241, 251, 261, 271 can be configured to read a voltage level (e.g., storage cell $V_{th}$) of respective logic states (L0-L7) 210, 220, 230, 240, 250, 260, 270, 280 (e.g., R1=overlap between L0 and L1, R2=overlap between L1 and L2, etc.). As shown in FIG. 2, there is little or no overlap between logic states (L0-L7) 210, 220, 230, 240, 250, 260, 270, 280, which indicates the binary (definitive) nature of binary (non-overlapping) threshold voltage ($V_{th}$) distribution 200.

As shown in FIG. 3, actual (overlapping) threshold voltage ($V_{th}$) distribution 300 can include bit line (BL) count 302 (e.g., number of cells), read voltage 304 (e.g., storage cell $V_{th}$), logic states (L0-L7) 310, 320, 330, 340, 350, 360, 370, 380, and read levels (R1-R7) 311, 321, 331, 341, 351, 361, 371. Actual (overlapping) threshold voltage ($V_{th}$) distribution 300 can be utilized for soft error injection (e.g., variable 0 or 1 state based on a probability). Actual (overlapping) threshold voltage ($V_{th}$) distribution 300 can be utilized to read binary data (e.g., user data 510) from memory (e.g., NAND flash device 160). In some aspects, as shown in FIG. 3, BL count 302 (e.g., vertical axis) refers to the number of memory cells where the threshold voltage ($V_{th}$) (e.g., horizontal axis) corresponds to that value, and therefore reflects the distribution of the threshold voltage ($V_{th}$). In some aspects, as shown in FIG. 3, actual (overlapping) threshold voltage ($V_{th}$) distribution 300 can include lower page 302a, middle page 302b, and upper page 302c of binary data (e.g., three pages of a triple-level cell (TLC)), which reflects the relationship between the specific logic state (L0-L7) and the corresponding threshold voltage ($V_{th}$).

In some aspects, an actual (overlapping) threshold voltage ($V_{th}$) distribution can be used for a MLC, a TLC, a QLC, or similar storage architectures. For example, as shown in FIG. 3, actual (overlapping) threshold voltage ($V_{th}$) distribution 300 corresponds to a TLC with three pages (e.g., lower page 302a, middle page 302b, upper page 302c). In some aspects, each memory cell of actual (overlapping) threshold voltage ($V_{th}$) distribution 300 is configured to store n-bit of data, where n is a whole number larger than 1. For example, n=2 corresponds to a multi-level cell (MLC) that stores two bits of data and has a total of four logic states ($2^2$). For example, as shown in FIG. 3, n=3 corresponds to a triple-level cell (TLC) that stores three bits of data (e.g., lower page 302a, middle page 302b, and upper page 302c) and has a total of eight logic states ($2^3$) (e.g., L0-L7). For example, n=4 corresponds to a quad-level cell (QLC) that stores four bits of data and has a total of sixteen logic states ($2^4$).

Logic states (L0-L7) 310, 320, 330, 340, 350, 360, 370, 380 can be configured to be non-binary (e.g., overlapping) and each can represent a target logic state (e.g., bit line information) of binary data (e.g., user data 510). In some aspects, memory system 100 can include NAND flash memory devices 160 (e.g., with memory cache 162) with triple-level cells (TLC) that can store three bits per cell. For example, as shown in FIG. 3, actual (overlapping) threshold voltage ($V_{th}$) distribution 300 can include one erase state (e.g., L0=[111] 310) and seven logic states (e.g., L1=[011] 320, L2=[001] 330, L3=[000] 340, L4=[010] 350, L5=[110] 360, L6=[100] 370, L7=[101] 380).

Read levels (R1-R7) 311, 321, 331, 341, 351, 361, 371 can be configured to read a voltage level (e.g., storage cell $V_{th}$) of respective logic states (L0-L7) 310, 320, 330, 340, 350, 360, 370, 380 (e.g., R1=overlap between L0 and L1, R2=overlap between L1 and L2, etc.). As shown in FIG. 3, there is a range of overlap between logic states (L0-L7) 310, 320, 330, 340, 350, 360, 370, 380, which indicates the non-binary (variable) nature of actual (overlapping) threshold voltage ($V_{th}$) distribution 300.

As shown in FIG. 4, threshold voltage ($V_{th}$) probability distribution process 400 can include first logic state 410 (e.g., L4), second logic state 420 (e.g., L5), first reference voltage 430, second reference voltage 432, third reference voltage 434, fourth reference voltage 436, and/or fifth reference voltage 438. Threshold voltage ($V_{th}$) probability distribution process 400 can define different bin intervals (e.g., $-3\sigma$, $-2\sigma$, $-\sigma$, 0, $+\sigma$, $+2\sigma$, $+3\sigma$) of the threshold voltage ($V_{th}$) for each logic state (e.g., first logic state 410, second logic state 420), for example, separated by first, second, third, fourth, and fifth reference voltages 430, 432, 434, 436, 438.

Threshold voltage ($V_{th}$) probability distribution process 400 can be further configured to sort (e.g., determine a statistical probability) bit line bin intervals (e.g., first, second, third, fourth, and fifth reference voltages 430, 432, 434, 436, 438) of the threshold voltage ($V_{th}$) relative to preset threshold voltage ($V_{th}$) offsets. Threshold voltage ($V_{th}$) probability distribution process 400 can be further configured for soft error injection (e.g., variable 0 or 1 state based on a probability). Threshold voltage ($V_{th}$) probability distribution process 400 can be further configured to read binary data (e.g., user data 510).

First logic state 410 can include first decision bin (A1) 412 with first bin probability 413, second decision bin (B1) 414 with second bin probability 415, and/or third decision bin (C1) 416 with third bin probability 417. First decision bin (A1) 412 represents the probability of a bit being in a 1 state for a specified bin interval of first logic state 410 (e.g., between $-3\sigma$ and $-\sigma$) having first bin probability 413 (e.g., 90%). Second decision bin (B1) 414 represents the probability of a bit being in a 1 state for a specified bin interval of first logic state 410 (e.g., between $-\sigma$ and $+\sigma$) having second bin probability 415 (e.g., 65%). Third decision bin (C1) 416 represents the probability of a bit being in a 1 state for a specified bin interval of first logic state 410 (e.g., between $+\sigma$ and $+2\sigma$) having third bin probability 415 (e.g., 55%).

Second logic state 420 can include first decision bin (A0) 422 with first bin probability 423, second decision bin (B0) 424 with second bin probability 425, and/or third decision bin (C0) 426 with third bin probability 427. First decision bin (A0) 422 represents the probability of a bit being in a 0 state for a specified bin interval of second logic state 420 (e.g., between $+\sigma$ and $+3\sigma$) having first bin probability 423 (e.g., 90%). Second decision bin (B0) 424 represents the probability of a bit being in a 0 state for a specified bin interval of second logic state 420 (e.g., between $-\sigma$ and $+\sigma$) having second bin probability 425 (e.g., 65%). Third decision bin (C0) 426 represents the probability of a bit being in a 0 state for a specified bin interval of second logic state 420 (e.g., between $-2\sigma$ and $-\sigma$) having third bin probability 425 (e.g., 55%).

First, second, third, fourth, and fifth reference voltages 430, 432, 434, 436, 438 can be used to measure the probability of a bit being in a 1 state or a 0 state. First reference voltage ($V_{REF1}$) 430 can be measured between third decision bin (C1) 416 of first logic state 410 and third decision bin (C0) 426 of second logic state 420, for example, at $+2\sigma$ of first logic state 410 and $-2\sigma$ of second logic state 420. Second reference voltage ($V_{REF2}$) 432 can be measured between third decision bin (C0) 426 and second decision bin (B0) 424 of second logic state 420, for example, at $-\sigma$ of second logic state 420. Third reference voltage ($V_{REF3}$) 434 can be measured between third decision bin (C1) 416 and second decision bin (B1) 414 of first logic state 410, for example, at +σ of first logic state 410. Fourth reference voltage ($V_{REF4}$) 436 can be measured between second decision bin (B0) 424 and first decision bin (A0) 426 of second logic state 420, for example, at +σ of second logic state 420. Fifth reference voltage ($V_{REF5}$) 438 can be measured between first decision bin (A1) 412 and second decision bin (B1) 414 of first logic state 410, for example, at −σ of first logic state 410.

Exemplary Soft Decode Verification Method

Memory device architectures can provide ultra-high density storage. For example, a 3D NAND flash memory device can be formed from a vertically stacked array of alternating conductive and dielectric layers. A memory channel can be formed in the alternating layers and filled with appropriate materials (e.g., semiconductor) to form a plurality of memory cells simultaneously (e.g., NAND string). A single level cell (SLC) can store one bit per cell and includes one erase state and one logic state. A multi-level cell (MLC) can store two bits per cell and includes one erase state and three logic states. A triple-level cell (TLC) can store three bits per cell and includes one erase state and seven logic states. A quad-level cell (QLC) can store four bits per cell and includes one erase state and fifteen logic states.

In 3D NAND flash, memory cells of the memory strings can be combined into pages for programming and read operations (e.g., 128k cells per page). The pages can be combined into blocks for erase operations (e.g., 64 pages per block). The blocks can be combined into planes for cache and data registers (e.g., 500 blocks per plane). The planes can be combined into dies for multi-plane operations and feature registers (e.g., 4 planes per die). The dies can be combined into targets for interleave and input-output (I/O) operations (e.g., 4 dies per target). The targets can be combined into devices (e.g., 4 targets per device). Program operations (e.g., write) can occur in groups or pages of memory cells. Read operations can occur in pages or smaller sets of memory cells.

However, memory devices are susceptible to errors (e.g., bit flips), which can cause unintentional logic state switching (e.g., 0 to 1 or 1 to 0) of a bit stored in a memory array. Errors are inherent to NAND storage and can be caused by, but not limited to, (a) alpha particles from memory package decay, (b) cosmic rays creating energetic neutrons and/or protons, (c) thermal neutrons, or (d) random noise or signal integrity issues (e.g., inductive coupling, capacitive coupling, crosstalk, etc.).

Error correcting code (ECC) can be used to add redundant data or parity data to a message such that the message can be recovered by a receiver, even when a number of errors are introduced to the message. In general, the ECC can correct the errors up to the capability of the code being used. LDPC is a form of ECC to minimize errors of a memory device, e.g., a NAND flash device. LDPC can utilize two modes: hard-decision decoding and soft-decision decoding.

LDPC decoding is generally conducted using hard-decision decoding in the early lifetime of the memory device (e.g., flash device). Hard-decision decoding (hard decode) offers reasonable decoder error correction capability with no loss in performance due to increased read latency. As the memory device ages and the error rates increase, the decoding capability is increased if soft-decision decoding is employed. Soft-decision decoding (soft decode) provides more information to the decoder as to the likelihood of which bits may be in error, but at the expense of increased read latency and reduced read performance. The advantage of soft decode is that it has stronger error correction ability and higher error correction rate for expected error data with a log-likelihood ratio (LLR) (e.g., logarithmic ratio between the probability a bit is in a 0 state and the probability the bit is in a 1 state in a specific region) and can tolerate higher bit error rate (BER). In general, soft decode has good error correction performance but is slower than hard decode due to the need for multiple reads of the error codes.

Currently, there is no effective error injection method to accurately and efficiently verify the LDPC soft decode error correction capabilities in a memory device (e.g., NAND flash device). LDPC soft decode error correction capabilities need to be verified to confirm whether a memory device meets specified design requirements. An error injection method can be used to generate a certain number of bit flips (e.g., errors) so that a threshold voltage ($V_{th}$) distribution can be generated to verify an LDPC unit's error correction capabilities. By creating an overlapping threshold voltage ($V_{th}$) distribution (e.g., pattern), error injection can utilize a more realistic threshold voltage ($V_{th}$) distribution to more accurately verify LDPC soft decode error correction capabilities.

Aspects of memory apparatuses, systems, and methods as discussed below can provide an error injection method to accurately and efficiently verify LDPC soft decode error correction capabilities of a memory system, decrease soft errors, increase error correction efficiency, leverage statistical threshold voltage ($V_{th}$) probability distributions (e.g., big data) for corresponding target logic states to more accurately model the actual (real) threshold voltage ($V_{th}$) distribution of data written on a memory device, utilize random mapping to flexibly and quickly map data written on the memory device to a pattern based on existing error data statistics as a template to increase error correction accuracy and efficiency, and utilize a host for data processing to increase performance of LDPC soft decode verification and reduce firmware overhead.

Figure 6:
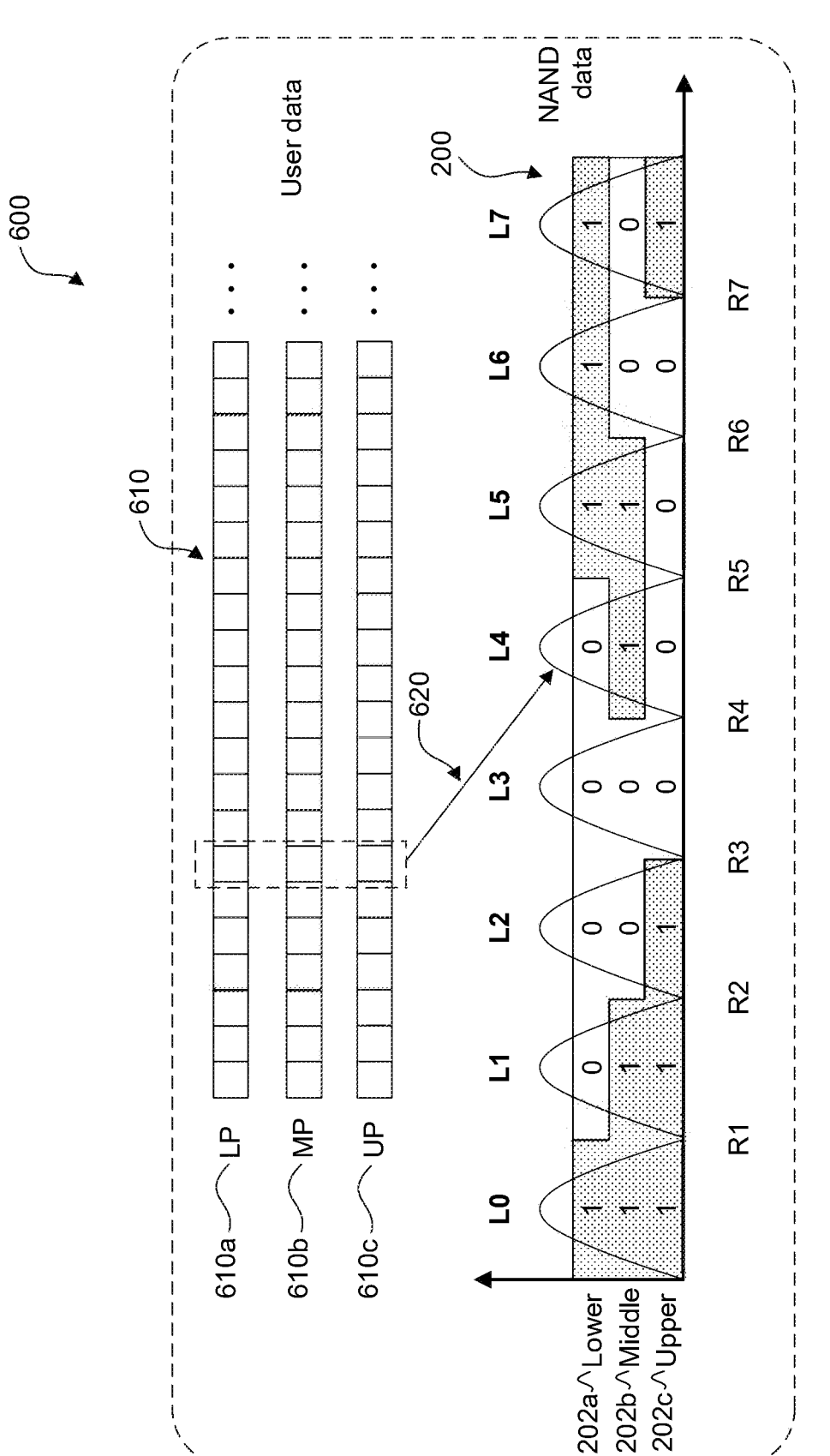
FIG. 6 is a schematic illustration of a raw user data process of the LDPC soft decode verification method shown in FIG. 5, according to an exemplary aspect.
Figure 7:
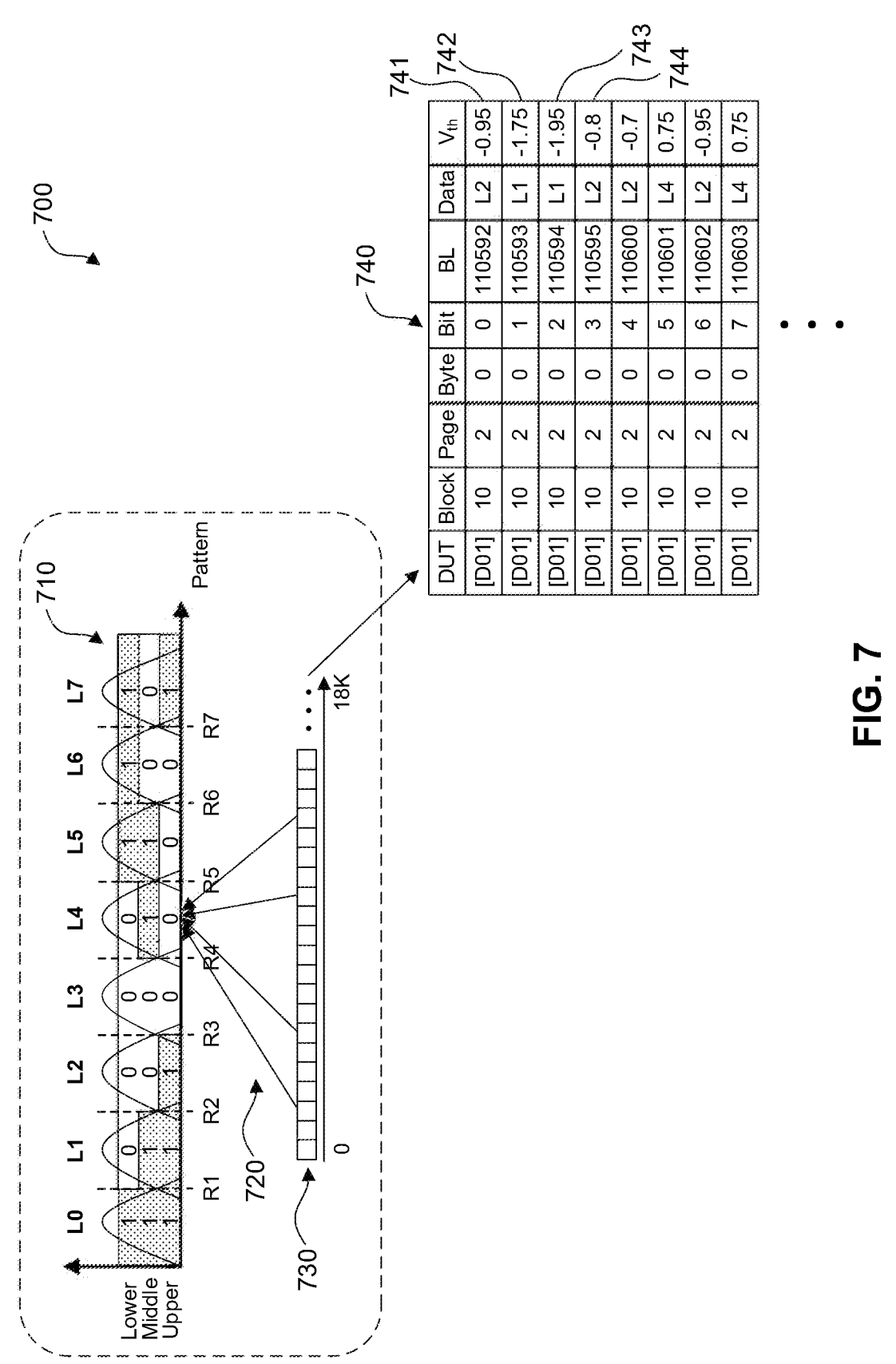
FIG. 7 is a schematic illustration of a pattern of the LDPC soft decode verification method shown in FIG. 5, according to an exemplary aspect.
Figure 8:
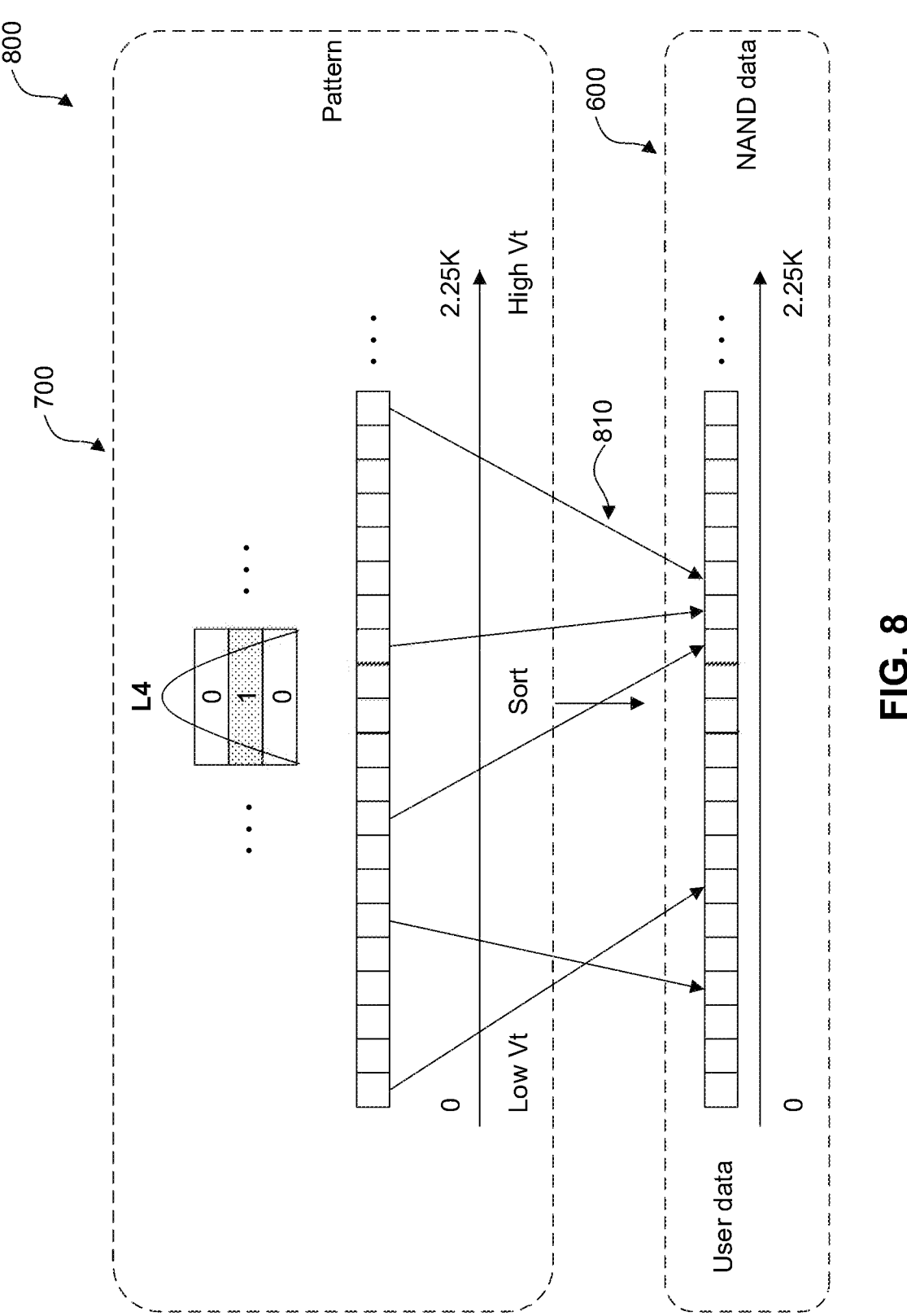
FIG. 8 is a schematic illustration of a mapping process of the LDPC soft decode verification method shown in FIG. 5, according to an exemplary aspect.
Figure 9:
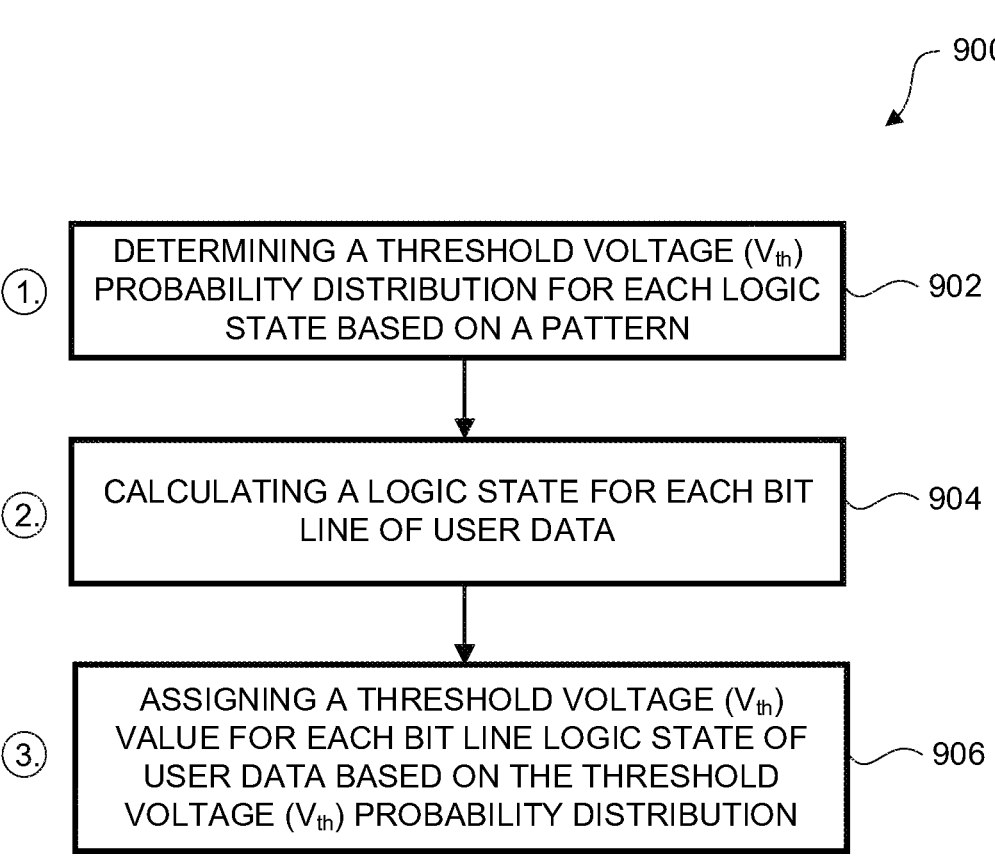
FIG. 9 illustrates a mapping flow diagram for the mapping process shown in FIG. 8, according to an exemplary aspect.
Figure 10:
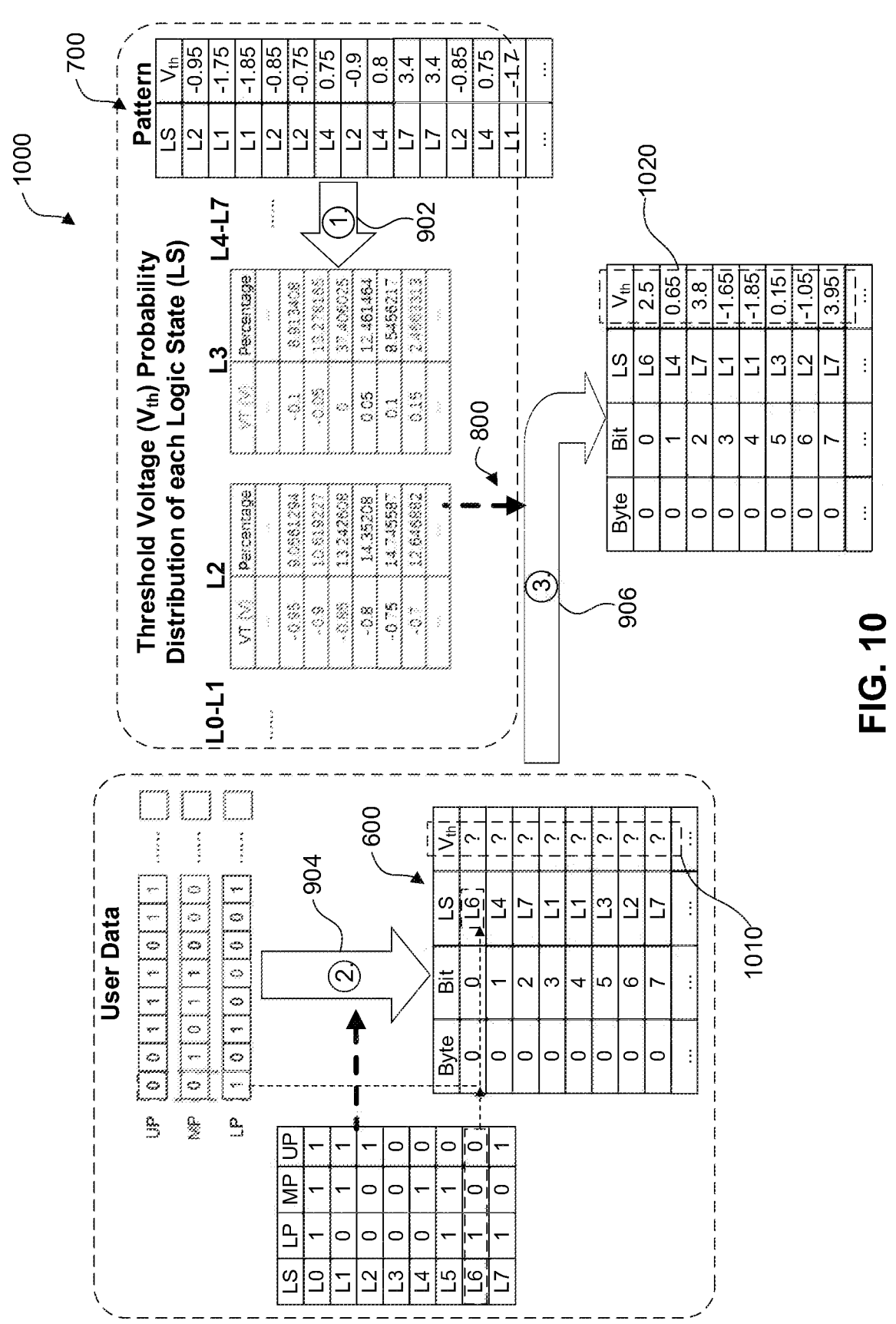
FIG. 10 is a schematic illustration of a threshold voltage ($V_{th}$) generation process of the LDPC soft decode verification method shown in FIG. 5, according to an exemplary aspect.
Figure 11:
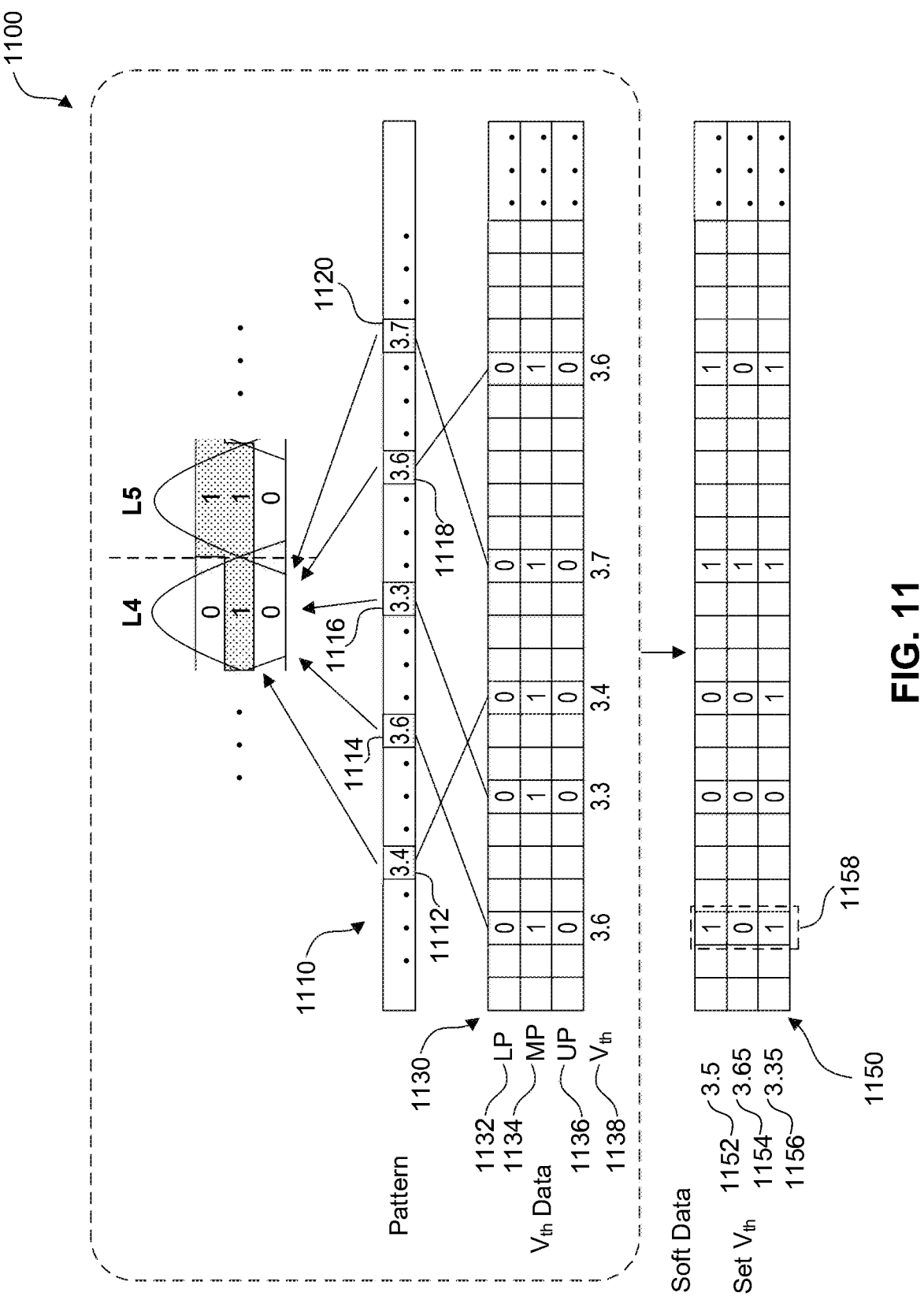
FIG. 11 is a schematic illustration of a soft data generation process of the LDPC soft decode verification method shown in FIG. 5, according to an exemplary aspect.

FIGS. 5-11 illustrate LDPC soft decode verification method 500, according to various exemplary aspects. FIG. 5 is a schematic illustration of LDPC soft decode verification method 500, according to an exemplary aspect. FIG. 6 is a schematic illustration of raw user data process 600 of LDPC soft decode verification method 500 shown in FIG. 5, according to an exemplary aspect. FIG. 7 is a schematic illustration of pattern 700 of LDPC soft decode verification method 500 shown in FIG. 5, according to an exemplary aspect. FIG. 8 is a schematic illustration of mapping process 800 of LDPC soft decode verification method 500 shown in FIG. 5, according to an exemplary aspect. FIG. 9 illustrates mapping flow diagram 900 for mapping process 800 shown in FIG. 8, according to an exemplary aspect. FIG. 10 is a schematic illustration of threshold voltage ($V_{th}$) generation process 1000 of LDPC soft decode verification method 500 shown in FIG. 5, according to an exemplary aspect. FIG. 11 is a schematic illustration of soft data generation process 1100 of LDPC soft decode verification method 500 shown in FIG. 5, according to an exemplary aspect.

LDPC soft decode verification method 500 can be configured to provide an error injection method to accurately and efficiently verify LDPC soft decode error correction capabilities of memory system 100 (e.g., LDPC unit 112). LDPC soft decode verification method 500 can be further configured to decrease errors (e.g., bit flips) and increase error correction efficiency in memory system 100 (e.g., LDPC unit 112).

LDPC soft decode verification method 500 can be further configured to generate threshold voltage ($V_{th}$) values for corresponding logic states (e.g., L0-L7) of binary data based on a pattern (e.g., pattern 700). LDPC soft decode verification method 500 can be further configured to leverage statistical threshold voltage ($V_{th}$) probability distributions (e.g., big data) for corresponding logic states to more accurately model actual (real) threshold voltage ($V_{th}$) distributions of data written on memory system 100 (e.g., via pattern 700).

LDPC soft decode verification method 500 can be further configured to utilize a random mapping process (e.g., mapping process 800) to flexibly and quickly map data written on memory system 100 (e.g., raw user data process 600) to a pattern (e.g., pattern 700) based on existing error data statistics (e.g., based on at least 1,000 chips manufactured under similar conditions) as a template to increase error correction accuracy and efficiency. In some aspects, LDPC soft decode verification method 500 can be further configured to utilize a host for data processing to increase performance of LDPC soft decode verification and reduce firmware overhead.

Although LDPC soft decode verification method 500 is shown in FIGS. 5-11 as a stand-alone apparatus, system, and/or method, the aspects of this disclosure can be used with other apparatuses, systems, and/or methods, such as, but not limited to, memory controller 110, memory system 100, binary threshold voltage ($V_{th}$) distribution 200, actual threshold voltage ($V_{th}$) distribution 300, threshold voltage ($V_{th}$) probability distribution process 400, soft decode process 560, raw user data process 600, pattern 700, mapping process 800, mapping flow diagram 900, threshold voltage ($V_{th}$) generation process 1000, soft data generation process 1100, flow diagram 1200, and/or flow diagram 1300.

As shown in FIG. 5, LDPC soft decode verification method 500 can include user data 510, LDPC unit 520, memory 530 (e.g., NAND flash device 160), raw user data process 600, pattern 700, mapping process 800, mapping flow diagram 900, threshold voltage ($V_{th}$) generation process 1000, soft decode process 560, and/or soft data generation process 1100. In some aspects, LDPC unit 520 can include LDPC unit 112 of memory system 100 shown in FIG. 1. In some aspects, memory 530 can include NAND flash memory devices 160 of memory system 100 shown in FIG. 1. In some aspects, raw user data process 600, pattern 700, mapping process 800, mapping flow diagram 900, threshold voltage ($V_{th}$) generation process 1000, and/or soft data generation process 1100 can include and/or be executed by memory controller 110 of memory system 100 shown in FIG. 1. In some aspects, soft decode process 560 and/or soft data generation process 1100 can include and/or be executed LDPC soft decoder 114 of memory system 100 shown in FIG. 1.

User data 510 can be coupled to (e.g., written/read) or received by LDPC unit 520 via first signal connection 512. In some aspects, user data 510 can include at least three pages of data (e.g., lower page (LP), middle page (MP), upper page (UP)), for example, when written to memory 530 (e.g., memory cache 162). For example, as shown in FIG. 6, binary user data 610 (e.g., user data 510) can include lower page (LP) 610*a*, middle page (MP) 610*b*, and upper page (UP) 610*c* of pure binary data (e.g., only 0 or 1 states with no overlapping threshold voltage ($V_{th}$) data). In some aspects, user data 510 can be based on a triple-level cell (TLC) memory scheme. For example, as shown in FIGS. 2 and 6, binary threshold ($V_{th}$) distribution 200 can include lower page (LP) 202*a*, middle page (MP) 202*b*, and upper page (UP) 202*c* for corresponding logic states L0-L7.

LDPC unit 520 can be configured to receive user data 510 (e.g., via memory controller 110) and encode user data 510 (e.g., write) to memory 530 (e.g., memory cache 162). In some aspects, LDPC unit 520 can be coupled to memory cache 162 via second signal connection 514. In some aspects, memory cache 162 can be configured to store user data 510 (e.g., via memory controller 110). In some aspects, memory cache 162 can be further configured to store encoded user data 510 from LDPC unit 520.

User data 510 can be read (raw) from memory 530 (e.g., memory cache 162) via third signal connection 532 via raw user data process 600 (shown in FIG. 6). During raw user data process 600, LDPC unit 520 can be turned off so that raw user data 510 can be read from memory 530 (e.g., via memory controller 110). Raw user data 510 from raw user data process 600 can be mapped to pattern 700 (shown in FIG. 7) via mapping process 800 (shown in FIG. 8), as described in detail below.

Mapping process 800 (e.g., including mapping flow diagram 900 shown in FIG. 9) can generate threshold voltage ($V_{th}$) values for corresponding logic states (e.g., L0-L7) of raw user data 510 via threshold voltage ($V_{th}$) generation process 1000 (shown in FIG. 10), as described in detail below.

Generated threshold voltage ($V_{th}$) values 1020 from threshold voltage ($V_{th}$) generation process 1000 can be combined via fourth signal connection 542 with preset threshold voltage ($V_{th}$) offset 570 of soft decode process 560 (e.g., via memory controller 110 and/or LDPC soft decoder 114) via fifth signal connection 572. Soft data generation process 1100 (shown in FIG. 11) can generate soft data based on the combined generated threshold voltage ($V_{th}$) values 1020 and preset threshold voltage ($V_{th}$) offset 570, as described in detail below.

Generated soft data 1150 can be written (raw) to memory 530 (e.g., memory cache 162) via sixth signal connection 574. Again, LDPC unit 520 remains off so that generated soft data 1150 can be written to memory 530 (e.g., via memory controller 110 and/or LDPC soft decoder 114). Memory 530 (e.g., memory cache 162) can be configured to store generated soft data 1150 from soft data generation process 1100.

LDPC unit 520 can be configured to read generated soft data 1150 from memory 530 (e.g., memory cache 162). LDPC unit 520 can be coupled to memory 530 (e.g., memory cache 162) via seventh signal connection 576. LDPC unit 520 can be configured to decode generated soft data 1150 (e.g., read) from memory 530 (e.g., memory cache 162), a decoding process that can include read soft data 580 and decode soft data 590 of soft decode process 560 via eighth signal connection 578 and ninth signal connection 582, respectively. Memory controller 110 can compare (e.g., verify) encoded user data 510 to corresponding decoded generated soft data 1150 from LDPC unit 520 to verify a LDPC soft decode capability of LDPC unit 520 (e.g., reliability percentage). In some aspects, a host or external test equipment can compare (e.g., verify) encoded user data 510 to decoded generated soft data 1150 to verify a LDPC soft decode capability of LDPC unit 520. In some aspects, LDPC unit 520 can also perform an error correction procedure for any bits that do not match between encoded user data 510 to decoded generated soft data 1150, and the corrected data can be written to memory 530 (e.g., via memory controller 110).

In some aspects, LDPC soft decode verification method 500 can include reading user data 510 (e.g., binary data), generating threshold voltage ($V_{th}$) values 1020 (shown in FIG. 10) for corresponding logic states (e.g., L0-L7) of user data 510, generating soft data 1150 (shown in FIG. 11) based on generated threshold voltage ($V_{th}$) values 1020, and comparing (e.g., verifying) soft data 1150 to user data 510.

In some aspects, LDPC soft decode verification method 500 can include verifying a LDPC soft decode error correction capability of memory system 100. For example, as shown in FIG. 5, LDPC unit 520 can compare (e.g., verify) encoded user data 510 to decoded soft data 1150 and verify a LDPC soft decode error correction capability of memory system 100 based on the comparison, for example, a reliability percentage.

In some aspects, LDPC soft decode verification method 500 can include correcting errors in user data 510 based on the comparison of soft data 1150 to user data 510. In some aspects, LDPC soft decode verification method 500 can include writing corrected user data 510 to memory 530 (e.g., NAND flash memory devices 160).

In some aspects, LDPC soft decode verification method 500 can include mapping binary data to a pattern to generate threshold voltage ($V_{th}$) values. For example, as shown in FIG. 5, LDPC soft decode verification method 500 can include mapping process 800 that maps user data 510 to pattern 700 to generate threshold voltage ($V_{th}$) values 1020.

In some aspects, LDPC soft decode verification method 500 can include (a) receiving user data 510 (e.g., via memory controller 110), (b) encoding user data 510 with LDPC unit 520, (c) writing encoded user data 510 to memory 530 (e.g., memory cache 162), (d) reading raw user data 510 from memory 530 (e.g., memory cache 162), (e) mapping raw user data 510 to pattern 700, (f) generating threshold voltage ($V_{th}$) values 1020 for raw user data 510 based on mapping process 800 with pattern 700, (g) generating soft data 1150 based on threshold voltage ($V_{th}$) values 1020 and preset threshold voltage ($V_{th}$) offsets 570, (h) writing soft data 1150 to memory 530 (e.g., memory cache 162), (i) decoding soft data 1150 with LDPC unit 520, and ( ) verifying an error correction capability of LDPC unit 520 based on a comparison between encoded user data 510 and decoded soft data 1150.

In some aspects, LDPC soft decode verification method 500 can further include repeating steps (g) through (i) for each threshold voltage ($V_{th}$) value. In some aspects, memory 530 can include triple-level cells (TLC). In some aspects, memory system 100 can include a 3D NAND device.

As shown in FIG. 6, raw user data process 600 can include binary user data 610, bit line (BL) voltage read 620 (e.g., BL count), and binary threshold voltage ($V_{th}$) distribution 200. Raw user data process 600 can be configured to read and convert binary user data 610 (e.g., only 0 or 1 states with no overlapping threshold voltage ($V_{th}$) data) into corresponding logic states (e.g., L0-L7). In some aspects, as shown in FIG. 6, binary user data 610 can include lower page (LP) 610a, middle page (MP) 610b, and upper page (UP) 610c, for example, in a triple-level cell (TLC) memory scheme.

BL voltage read 620 reads a bit value for each page (e.g., three pages) of each bit line of binary user data 610 to generate binary threshold voltage ($V_{th}$) distribution 200. As shown in FIGS. 2 and 6, there is no overlapping threshold voltage ($V_{th}$) distributions between adjacent logic states (e.g., between L0 and L1, between L1 and L2, etc.). In some aspects, raw user data process 600 can include reading a logic state (e.g., L0-L7) of each bit line of user data 510.

As shown in FIG. 7, pattern 700 can include threshold voltage ($V_{th}$) distribution 710, conversion per logic state 720, threshold voltage ($V_{th}$) value per logic state 730, and threshold voltage ($V_{th}$) distribution table 740. Pattern 700 can be configured to represent statistical threshold voltage ($V_{th}$) probability distributions of corresponding logic states (e.g., L0-L7). In some aspects, threshold voltage ($V_{th}$) distribution 710 can be similar to actual threshold voltage ($V_{th}$) distribution 300 shown in FIG. 3, with overlapping threshold voltage ($V_{th}$) distributions between adjacent logic states.

Threshold voltage ($V_{th}$) distribution 710 can be measured for a plurality of memory devices (e.g., NAND flash devices 160) to generate big data (e.g., a large volume data set). In some aspects, the plurality of memory devices can include data from a similar type (e.g., design) of memory device and/or data from memory devices made from a similar manufacturing process. For example, the big data can include about 100 similar memory chips, about 500 similar memory chips, about 1,000 similar memory, about 5,000 similar memory chips, and/or about 10,000 similar memory chips.

Conversion per logic state 720 can be conducted to extract a corresponding threshold voltage ($V_{th}$) value per logic state 730 (e.g., threshold voltage ($V_{th}$) for each type of logic state, e.g., L0-L7). In some aspects, the logic state chosen can be random. Each threshold voltage ($V_{th}$) value per logic state 730 can be stored to form threshold voltage ($V_{th}$) distribution table 740 (e.g., big data). As shown in FIG. 7, threshold voltage ($V_{th}$) distribution table 740 can include a table of logic states and corresponding threshold voltage ($V_{th}$) values, for example, first, second, third, and fourth threshold voltage ($V_{th}$) values 741, 742, 743, 744. In some aspects, threshold voltage ($V_{th}$) distribution table 740 can be based on some or all memory cells in one or more devices under test (DUT) (e.g., NAND flash devices 160). In some aspects, threshold voltage ($V_{th}$) distribution table 740 can be based on all memory cells in multiple (e.g., at least 1,000) DUTs.

In some aspects, pattern 700 can be generated from big data of memory system 100 (e.g., NAND flash devices 160). In some aspects, pattern 700 can be based on big data of memory system 100. In some aspects, the big data can include statistical threshold voltage ($V_{th}$) probability distributions (e.g., L2 has $V_{th}$=-0.75 V with 14% probability, etc.) of each corresponding logic state (e.g., L0-L7). In some aspects, the big data can include statistical threshold voltage ($V_{th}$) probability distributions based on at least 1,000 similarly manufactured memory devices (e.g., similar to memory system 100, similar to NAND flash memory device 160, etc.).

In some aspects, the big data can include statistical threshold voltage ($V_{th}$) probability distributions based on a read level granularity of the memory system 100. For example, the read level granularity can be about 100 mV, about 50 mV, about 10 mV, about 5 mV, about 1 mV, about 100 μV, about 50 μV, about 10 μV, about 5 μV, and/or about 1 μV.

In some aspects, pattern 700 can be generated from statistically measuring threshold voltage ($V_{th}$) probability distributions of each corresponding logic state (e.g., L0-L7) of user data 510. In some aspects, pattern 700 can be generated from compiling threshold voltage ($V_{th}$) values for each logic state (e.g., L0-L7) for at least 1,000 similarly manufactured memory devices (e.g., similar to memory system 100, similar to NAND flash memory device 160, etc.).

As shown in FIG. 8, mapping process 800 can include pattern 700, sorting process 810, and raw user data process 600. Mapping process 800 can be configured to map binary user data 610 from raw user data process 600 to pattern 700. In some aspects, sorting process 810 can be based on an algorithm to place binary user data 610 into an order corresponding to pattern 700 (e.g., threshold voltage ($V_{th}$) values). For example, sorting process 810 can include search and merge algorithms, a comparison sort, a non-comparison sort, a distribution sort, an index sort, a collation sort, and/or a combination thereof. In some aspects, sorting process 810 can be a random sorting process. In some aspects, sorting process 810 can include randomly mapping based on a random matrix that is multiplied by each original vector to result in a reduced vector.

In some aspects, mapping process 800 can include determining a threshold voltage ($V_{th}$) probability distribution for each logic state (e.g., L0-L7) of binary user data 610 based on pattern 700, calculating a logic state (e.g., L0-L7) for each bit line of binary user data 610, and/or assigning a threshold voltage ($V_{th}$) value for each bit line logic state (e.g., L0-L7) of binary user data 610 based on the threshold voltage ($V_{th}$) probability distribution.

In some aspects, mapping process 800 can include utilizing the same amount of bits of binary user data 610 as that used to randomly calculate the corresponding threshold voltage ($V_{th}$) probability distribution. For example, if binary user data 610 has 10,000 bits in a logic state L1 and L1 has $V_{th}$=−1.25 V with 4% probability (e.g., based on pattern 700), 400 bits can be selected randomly (e.g., 10,000 bits× 4%=400 bits) to calculate the corresponding threshold voltage ($V_{th}$) probability distribution for L1.

In some aspects, mapping process 800 can include randomly mapping binary user data 610 to pattern 700. In some aspects, mapping process 800 can include selecting a percentage of binary user data 610 based on a statistical probability of a corresponding threshold voltage ($V_{th}$) value and/or a read level granularity of memory system 100. In some aspects, memory controller 110 can be configured to randomly map binary user data 610 to corresponding threshold voltage ($V_{th}$) values based on pattern 700.

As shown in FIG. 9, mapping flow diagram 900 can include step 902, step 904, and/or step 906. Mapping flow diagram 900 can be configured to map binary user data 610 from raw user data process 600 to pattern 700. It is to be appreciated that not all steps in FIG. 9 are needed to perform the disclosure provided herein. Further, some of the steps may be performed simultaneously, sequentially, and/or in a different order than shown in FIG. 9. Mapping flow diagram 900 shall be described with reference to FIGS. 1, 5, 6, 8, and 10. However, mapping flow diagram 900 is not limited to those example aspects.

In step 902, as shown in the example of FIGS. 5, 8, and 10, a threshold voltage ($V_{th}$) probability distribution for each logic state (e.g., L0-L7) can be determined based on pattern 700 (e.g., big data). For example, as shown in FIG. 10, multiple individual threshold voltage ($V_{th}$) values for each type of logic state (e.g., L0-L7) can be measured (e.g., pattern 700) to generate a statistical threshold voltage ($V_{th}$) probability distribution (e.g., percentage) of each type of logic state (e.g., L0-L7). In some aspects, as shown in FIG. 10, the statistical threshold voltage ($V_{th}$) probability distribution (e.g., percentage) can change (be adjusted) based on a read level granularity, for example, 50 mV increments (e.g., 0 V, 0.05 V, 0.1 V, 0.15 V, etc.).

In step 904, as shown in the example of FIGS. 1, 5, 6, 8, and 10, a logic state (e.g., L0-L7) can be calculated for each bit line of binary user data 610. For example, as shown in FIGS. 6 and 10, binary user data 610, with lower page (LP) 610*a*, middle page (MP) 610*b*, and upper page (UP) 610*c* per bit line, can be calculated by raw user data process 600 to corresponding logic states (e.g., L0=[111], L1=[011], L2=[001], L3=[000], L4=[010], L5=[110], L6=[100], L7= [101]).

In step 906, as shown in the example of FIGS. 1, 5, 8, and 10, a threshold voltage ($V_{th}$) value can be assigned for each bit line logic state (e.g., L0-L7) of binary user data 610 based on the threshold voltage ($V_{th}$) probability distribution. For example, as shown in FIG. 10, mapping process 800 can assign threshold voltage ($V_{th}$) values 1020 to corresponding logic states (e.g., L0-L7) of binary user data 610 with unknown threshold voltage ($V_{th}$) values 1010.

As shown in FIG. 10, threshold voltage ($V_{th}$) generation process 1000 can include raw user data process 600, pattern 700, mapping process 800, step 902, step 904, step 906, unknown threshold voltage ($V_{th}$) values 1010, and threshold voltage ($V_{th}$) values 1020. Threshold voltage ($V_{th}$) generation process 1000 can be configured to generate (e.g., assign) threshold voltage ($V_{th}$) values 1020 for each corresponding bit line logic state (e.g., L0-L7) of binary user data 610, with unknown threshold voltage ($V_{th}$) values 1010, based on a threshold voltage ($V_{th}$) probability distribution of each logic state (e.g., pattern 700).

As discussed above, a threshold voltage ($V_{th}$) probability distribution for each logic state (e.g., L0-L7) can be determined based on pattern 700 (e.g., big data). In some aspects, pattern 700 can include multiple individual threshold voltage ($V_{th}$) values for each type of logic state (e.g., L0-L7) to generate a statistical threshold voltage ($V_{th}$) probability distribution (e.g., percentage) of each type of logic state (e.g., L0-L7). In some aspects, the statistical threshold voltage ($V_{th}$) probability distribution (e.g., percentage) can change (be adjusted) based on a read level granularity, for example, 50 mV increments (e.g., 0 V, 0.05 V, 0.1 V, 0.15 V, etc.).

A logic state (e.g., L0-L7) can be calculated for each bit line of binary user data 610. In some aspects, binary user data 610, with lower page (LP) 610*a*, middle page (MP) 610*b*, and upper page (UP) 610*c* per bit line, can be calculated by raw user data process 600 to corresponding logic states (e.g., L0=[111], L1=[011], L2=[001], L3=[000], L4=[010], L5=[110], L6=[100], L7=[101]) but with unknown threshold voltage ($V_{th}$) values 1010.

Threshold voltage ($V_{th}$) values 1020 can be generated (e.g., assigned) for each bit line logic state (e.g., L0-L7) of binary user data 610 with unknown threshold voltage ($V_{th}$) values 1010 based on the threshold voltage ($V_{th}$) probability distribution (e.g., pattern 700). In some aspects, mapping process 800 can assign threshold voltage ($V_{th}$) values 1020 to corresponding logic states (e.g., L0-L7) of binary user data 610 with unknown threshold voltage ($V_{th}$) values 1010.

As shown in FIG. 11, soft data generation process 1100 can include pattern constraints 1110, threshold voltage ($V_{th}$) values 1130, and soft data 1150. Soft data generation process 1100 can be configured to generate soft data 1150 for soft error injection. Soft data generation process 1100 can be further configured to generate soft data 1150 based on threshold voltage ($V_{th}$) values 1130 and preset threshold voltage ($V_{th}$) offset 570 (e.g., first, second, and third preset threshold voltage ($V_{th}$) offsets 1152, 1154, 1156).

Pattern constraints 1110 can include first, second, third, fourth, and fifth constraints 1112, 1114, 1116, 1118, 1120. In some aspects, pattern constraints 1110 can be based on different bin intervals (e.g., reference voltages) of a particular logic state (e.g., L0-L7). For example, as shown in FIG. 11, for logic state L4, first constraint 1112 can be $V_{th}$=3.4 V, second constraint 1114 can be $V_{th}$=3.6 V, third constraint 1116 can be $V_{th}$=3.3 V, fourth constraint 1118 can be $V_{th}$=3.6 V, and fifth constraint 1120 can be $V_{th}$=3.7 V. In some aspects, pattern constraints 1110 can include one or more variable nodes for soft data generation process 1100. In some aspects, pattern constraints 1110 can include x variable nodes of threshold voltage ($V_{th}$) data (e.g., pattern 700). For example, as shown in FIG. 11, pattern constraints 1110 can include five variable nodes for logic states (e.g., L0-L7) of pattern 700 (e.g., first, second, third, fourth, and fifth constraints 1112, 1114, 1116, 1118, 1120).

Threshold voltage ($V_{th}$) values 1130 can include lower page (LP) 1132, middle page (MP) 1134, upper page (UP) 1136, and threshold voltage ($V_{th}$) values 1138. In some aspects, threshold voltage ($V_{th}$) values 1130 can include threshold voltage ($V_{th}$) values 1020. Soft data 1150 can include soft error injection values. For example, as shown in FIG. 11, soft data 1150 can include soft error injection value 1158.

As shown in FIG. 11, soft data 1150 (e.g., soft error injection value 1158) can be generated by soft decoding threshold voltage ($V_{th}$) values 1130 based on preset threshold voltage ($V_{th}$) offset 570 (e.g., first, second, and third preset threshold voltage ($V_{th}$) offsets 1152, 1154, 1156). In some aspects, preset threshold voltage ($V_{th}$) offset 570 can simulate the actual behavior of binary user data 610 (e.g., similar to actual threshold voltage ($V_{th}$) distribution 300 shown in FIG. 3) by applying one or more constraints to threshold voltage ($V_{th}$) values 1130 and thereby generate soft data 1150 for soft error injection. For example, as shown in FIG. 11, first, second, and third preset threshold voltage ($V_{th}$) offsets 1152, 1154, 1156 can be set (e.g., read voltage) to 3.5 V, 3.65 V, and 3.35 V, respectively, for lower page (LP) 1132 (e.g., $V_{offset}$=3.5 V), middle page (MP) 1134 (e.g., $V_{offset}$=3.65 V), and upper page (UP) 1136 (e.g., $V_{offset}$=3.35 V), respectively, with the constraint that if threshold voltage ($V_{th}$) values 1138 are greater than first, second, and third preset threshold voltage ($V_{th}$) offsets 1152, 1154, 1156, bit state is read as a 1 state, and if threshold voltage ($V_{th}$) values 1138 are less than or equal to first, second, and third preset threshold voltage ($V_{th}$) offsets 1152, 1154, 1156, bit state is read as a 0 state.

For example, as shown in FIG. 11, threshold voltage ($V_{th}$) value 1138 of 3.6 V for L4 [010] would be read as a 1 state for lower page (LP) 1132 (e.g., $V_{th}$=3.6 V>$V_{offset}$=3.5 V), a 0 state for middle page (MP) 1134 (e.g., $V_{th}$=3.6 V<$V_{offset}$=3.65 V), and a 1 state for upper page (UP) 1136 (e.g., $V_{th}$=3.6 V>$V_{offset}$=3.35 V), generating soft error injection value 1158 with [101]. Additional soft data 1150 can be generated in a similar fashion as shown in FIG. 11 (e.g., $V_{th}$=3.3 V generates [000], $V_{th}$=3.4 V generates [001], $V_{th}$=3.7 V generates [111], $V_{th}$=3.6 V generates [101], etc.).

In some aspects, soft data generation process 1100 can be configured to write soft data 1150 to memory 530 (e.g., memory cache 162). For example, as shown in FIG. 5, memory cache 162 can be configured to store soft data 1150 written to memory cache 162 (e.g., via sixth signal connection 574) from soft data generation process 1100 (e.g., via LDPC soft decoder 114 shown in FIG. 1). In some aspects, as shown in FIG. 5, LDPC unit 520 can be configured to decode soft data 1150 (e.g., soft data generation process 1100) from memory 530 (e.g., memory cache 162). In some aspects, memory controller 110 can compare (e.g., verify) encoded binary user data 610 to decoded soft data 1150 (e.g., soft data generation process 1100), for example, to verify a LDPC soft decode error correction capability (e.g., reliability) of memory system 100.

In some aspects, soft data generation process 1100 can include sorting x variable nodes of the threshold voltage ($V_{th}$) data toy constraint nodes of the preset threshold voltage ($V_{th}$) offsets. For example, as shown in FIG. 11, soft data generation process 1100 can sort five variable nodes (e.g., first, second, third, fourth, and fifth constraints 1112, 1114, 1116, 1118, 1120) to three constraint nodes (e.g., first, second, and third preset threshold voltage ($V_{th}$) offsets 1152, 1154, 1156).

In some aspects, soft data generation process 1100 can include sorting five bit line bin intervals of threshold voltage ($V_{th}$) values 1130 relative to three preset threshold voltage ($V_{th}$) offsets. For example, as shown in FIG. 11, soft data generation process 1100 can sort five bit line bin intervals (e.g., first, second, third, fourth, and fifth constraints 1112, 1114, 1116, 1118, 1120) of threshold voltage ($V_{th}$) values 1130 to three preset threshold voltage ($V_{th}$) offsets (e.g., first, second, and third preset threshold voltage ($V_{th}$) offsets 1152, 1154, 1156). In some aspects, memory controller 110, a host, or external test equipment can be configured to determine a LDPC soft decode verification capability (e.g., reliability) of memory system 100 (e.g., LDPC unit 112).

Exemplary Flow Diagrams

Figure 12:
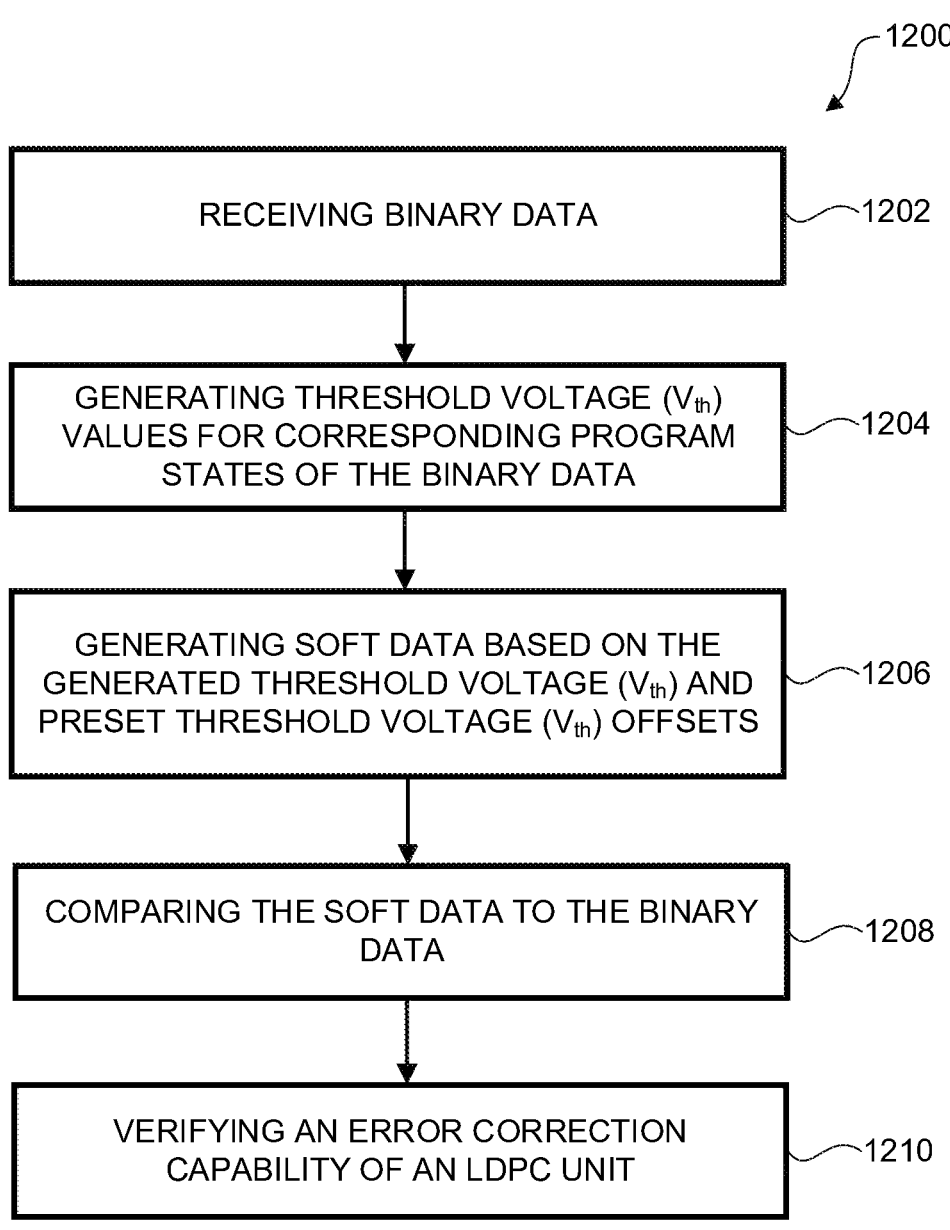
FIG. 12 illustrates a flow diagram for a LDPC soft decode verification method, according to an exemplary aspect.

FIG. 12 illustrates flow diagram 1200 for LDPC soft decode verification method 500 shown in FIGS. 1 and 5-11, according to exemplary aspects. It is to be appreciated that not all steps in FIG. 12 are needed to perform the disclosure provided herein. Further, some of the steps may be performed simultaneously, sequentially, and/or in a different order than shown in FIG. 12. Flow diagram 1200 shall be described with reference to FIGS. 1 and 5-11. However, flow diagram 1200 is not limited to those example aspects.

In step 1202, as shown in the example of FIGS. 1, 5, and 6, binary user data 610 can be read (e.g., via memory controller 110) via raw user data process 600.

In step 1204, as shown in the example of FIGS. 1 and 5-10, threshold voltage ($V_{th}$) values 1020 can be generated for corresponding logic states (e.g., L0-L7) of binary user data 610 via threshold voltage ($V_{th}$) generation process 1000 (e.g., including pattern 700, mapping process 800, mapping flow diagram 900).

In step 1206, as shown in the example of FIGS. 1, 5, and 11, soft data 1150 can be generated based threshold voltage ($V_{th}$) values 1020 and preset threshold voltage ($V_{th}$) offset 570 via soft data generation process 1100.

In step 1208, as shown in the example of FIGS. 1, 5, 6, and 11, soft data 1150 can be compared (e.g., verified) to binary user data 610 via LDPC unit 520 and/or soft decode process 560 (e.g., read soft data 580, decode soft data 590).

In step 1210, as shown in the example of FIGS. 1, 5, and 11, a decode capability (e.g., error correction) of LDPC unit 520 can be verified based on the comparison between soft data 1150 and binary user data 610, for example, by memory controller 110, a host, or external test equipment.

Figure 13:
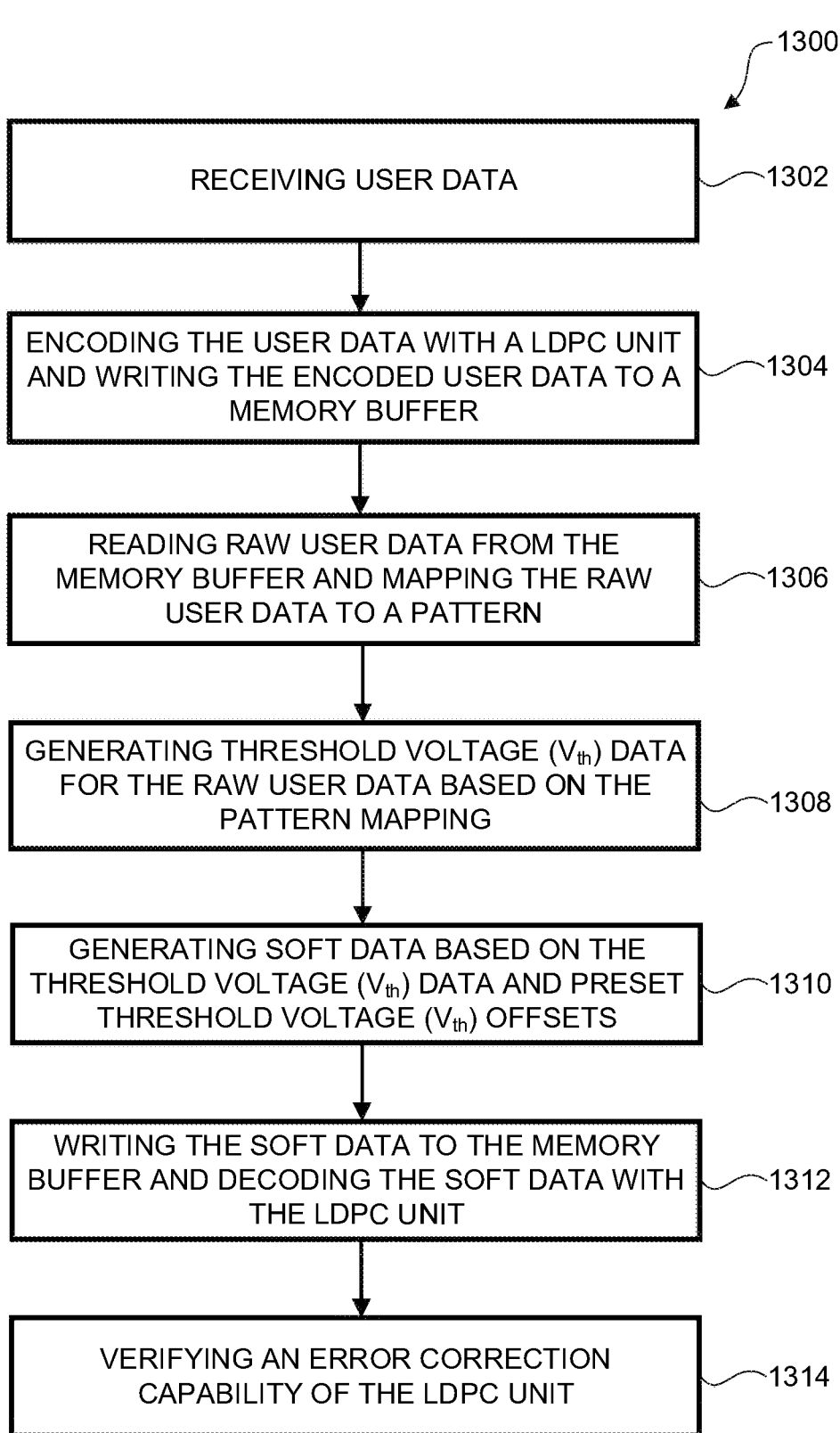
FIG. 13 illustrates a flow diagram for a LDPC soft decode verification method, according to an exemplary aspect.

FIG. 13 illustrates flow diagram 1300 for LDPC soft decode verification method 500 shown in FIGS. 1 and 5-11, according to exemplary aspects. It is to be appreciated that not all steps in FIG. 13 are needed to perform the disclosure provided herein. Further, some of the steps may be performed simultaneously, sequentially, and/or in a different order than shown in FIG. 13. Flow diagram 1300 shall be described with reference to FIGS. 1 and 5-11. However, flow diagram 1300 is not limited to those example aspects.

In step 1302, as shown in the example of FIGS. 1, 5, and 6, binary user data 610 can be read (e.g., via memory controller 110) via raw user data process 600.

In step 1304, as shown in the example of FIGS. 1, 5, and 6, binary user data 610 can be encoded by LDPC unit 520 and written to memory cache 162 of memory system 100.

In step 1306, as shown in the example of FIGS. 1 and 5-9, binary user data 610 can be read from memory cache 162 and mapped to pattern 700 via mapping process 800 and/or mapping flow diagram 900.

In step 1308, as shown in the example of FIGS. 1 and 5-10, threshold voltage ($V_{th}$) values 1020 can be generated for binary user data 610 based on the pattern mapping (e.g., mapping process 800) via threshold voltage ($V_{th}$) generation process 1000 (e.g., including pattern 700, mapping process 800, mapping flow diagram 900).

In step 1310, as shown in the example of FIGS. 1, 5, and 11, soft data 1150 can be generated based on threshold voltage ($V_{th}$) values 1020 and preset threshold voltage ($V_{th}$) offset 570 via soft data generation process 1100.

In step 1312, as shown in the example of FIGS. 1, 5, 6, and 11, soft data 1150 can be written to memory cache 162 and decoded by LDPC unit 520.

In step 1314, as shown in the example of FIGS. 1, 5, and 11, a decode capability (e.g., error correction) of LDPC unit 520 can be verified based on the comparison between soft data 1150 and binary user data 610. For example, memory controller 110 and/or soft decode process 560 (e.g., read soft data 1180, decode soft data 1190) can verify whether LDPC unit 520 returns encoded binary user data 610 for each decoded soft data 1150.

In some aspects, during normal operation of a memory system (e.g., memory system 100), an LDPC unit (e.g., LDPC unit 520) can first encode data (e.g., user data 510) and then write the encoded data to memory (e.g., via memory cache 162). Due to the memory itself, some data present in the memory cells will be wrong (e.g., include errors). When the data is read out, the LDPC unit (e.g., LDPC unit 520) can decode the data and correct the errors. Different LDPC units can have different error correction capabilities due to different algorithm parameters.

In some aspects, LDPC soft decode verification method 500 can simulate the errors of the memory (e.g., via pattern 700), manually inject the errors to generate verification data (e.g., via soft data generation process 1100), and LDPC unit 520, to be verified, can decode and read the verification data (e.g., soft data 1150) to verify an error correction capability of LDPC unit 520 (e.g., as verified by memory controller 110, an external host, or external test equipment).

In some aspects, LDPC soft decode verification method 500 can verify LDPC unit 112, 520 capable of being applied in memory system 100. In some aspects, LDPC soft decode verification method 500 can include receiving original data corresponding to a memory device (e.g., NAND flash device 160), provided in memory system 100, in which each memory cell is configured to store n-bit of data, wherein n is a whole number larger than 1. For example, as shown in FIGS. 1, 5, and 6, LDPC unit 520 can receive binary (original) user data 610 (e.g., user data 510) from NAND flash memory device 160, with lower page (LP) 610a, middle page (MP) 610b, and upper page (UP) 610c of pure binary data (e.g., only 0 or 1 states with no overlapping threshold voltage ($V_{th}$) data). In some aspects, user data 510 can be based on a triple-level cell (TLC) memory scheme (e.g., with n=3). For example, as shown in FIGS. 2 and 6, binary threshold ($V_{th}$) distribution 200 can include lower page (LP) 202a, middle page (MP) 202b, and upper page (UP) 202c for corresponding logic states L0-L7.

In some aspects, LDPC soft decode verification method 500 can further include encoding the original data (e.g., user data 510) by LDPC unit 520 to be verified. For example, as shown in FIG. 5, LDPC unit 520 can encode user data 510 (e.g., write) to memory 530 (e.g., in memory cache 162).

In some aspects, LDPC soft decode verification method 500 can further include injecting errors into the encoded original data (e.g., user data 610), by a data pattern (e.g., pattern 700) including the errors generated by threshold voltage ($V_{th}$) distributions interlaced between two neighboring logic states of $2^n$ logic states of the memory device (e.g., NAND flash device 160), for generating verifying data (e.g., generated threshold voltage ($V_{th}$) values 1020). For example, as shown in FIGS. 5-10, user data 510 can be read (raw) from memory 530 (e.g., from memory cache 162) via raw user data process 600 (shown in FIG. 6), raw user data 510 from raw user data process 600 can be mapped to pattern 700 (shown in FIG. 7) via mapping process 800 (shown in FIG. 8) to inject errors, and mapping process 800 (e.g., including mapping flow diagram 900 shown in FIG. 9) can generate threshold voltage ($V_{th}$) values 1020 for corresponding logic states (e.g., L0-L7) of raw user data 510 via threshold voltage ($V_{th}$) generation process 1000 (shown in FIG. 10).

In some aspects, LDPC soft decode verification method 500 can further include verifying a soft decode capability of LDPC unit 520 by utilizing the verifying data (e.g., generated threshold voltage ($V_{th}$) values 1020). For example, as shown in FIGS. 5 and 11, soft data generation process 1100 (shown in FIG. 11) can generate soft data based on the combined generated threshold voltage ($V_{th}$) values 1020 and preset threshold voltage ($V_{th}$) offset 570, LDPC unit 520 can decode generated soft data 1150 from memory 530 (e.g., memory cache 162) via soft decode process 560, and memory controller 110 (or a host) can compare (e.g., verify) encoded user data 510 to corresponding decoded generated soft data 1150 from LDPC unit 520 to verify a LDPC soft decode capability of LDPC unit 520 (e.g., reliability percentage).

In some aspects, the data pattern (e.g., pattern 700) can be obtained from real data information of the memory device (e.g., NAND flash memory device 160). For example, as shown in FIG. 7, threshold voltage ($V_{th}$) distribution 710 can be measured for a plurality of memory devices (e.g., NAND flash devices 160) to generate big data (e.g., a large volume data set). In some aspects, the real data information (e.g., threshold voltage ($V_{th}$) distribution 710) can include error information (e.g., threshold voltage ($V_{th}$) distribution table 740) of the memory device under different test environments. In some aspects, the real data information (e.g., threshold voltage ($V_{th}$) distribution 710) can include error information (e.g., threshold voltage ($V_{th}$) distribution table 740) of the memory device when storage operation is actually performed.

In some aspects, the error information (e.g., threshold voltage ($V_{th}$) distribution table 740) can include read-out data errors of the memory device due to overlapping threshold voltage ($V_{th}$) distributions of neighboring (adjacent) logic states (e.g., L4-L5) in different test environments. In some aspects, the different test environments can include different temperatures, different erase times, or a combination thereof. In some aspects, the error information (e.g., threshold voltage ($V_{th}$) distribution table 740) can include read-out data errors of the memory device due to overlapping threshold voltage ($V_{th}$) distributions of neighboring (adjacent) logic states (e.g., L4-L5) when actually performing storage operations (e.g., write).

In some aspects, the real data information (e.g., threshold voltage ($V_{th}$) distribution 710) can include the actual threshold voltage ($V_{th}$) corresponding to the memory cell where each data is located. For example, as shown in FIG. 7, threshold voltage ($V_{th}$) distribution table 740 can include a table of logic states, memory cell location (e.g., block, page, byte, bit, BL, etc.), and corresponding threshold voltage ($V_{th}$) values, for example, first, second, third, and fourth threshold voltage ($V_{th}$) values 741, 742, 743, 744. In some aspects, the real data information (e.g., threshold voltage ($V_{th}$) distribution 710) can include an address of the memory cell, the stored data, the corresponding threshold voltage ($V_{th}$), or a combination thereof (e.g., threshold voltage ($V_{th}$) distribution table 740). In some aspects, the real data information can be used to obtain the threshold voltage ($V_{th}$) distribution of memory cells of the memory device in different logic states (e.g., threshold voltage ($V_{th}$) distribution table 740). For example, as shown in FIG. 7, a corresponding threshold voltage ($V_{th}$) value per logic state 730 can be chosen for each type of logic state (e.g., L0-L7) to form threshold voltage ($V_{th}$) distribution table 740.

In some aspects, the data pattern (e.g., pattern 700) can include threshold voltage ($V_{th}$) distribution information of a plurality of memory cells of the memory device at different logic states (e.g., threshold voltage ($V_{th}$) distribution table 740). In some aspects, the data pattern (e.g., pattern 700) can include threshold voltage ($V_{th}$) distribution information of a plurality of memory cells of a single page of the memory device at different logic states (e.g., threshold voltage ($V_{th}$) distribution table 740).

In some aspects, injecting errors into the encoded original data can include assigning a threshold voltage ($V_{th}$) to the encoded original data according to the data pattern (e.g., pattern 700) for generating the verifying data (e.g., generated threshold voltage ($V_{th}$) values 1020). For example, as shown in FIG. 10, threshold voltage ($V_{th}$) generation process 1000 can assign threshold voltage ($V_{th}$) values 1020 for each corresponding logic state (e.g., L0-L7) of binary user data 610, with unknown threshold voltage ($V_{th}$) values 1010, based on a threshold voltage ($V_{th}$) probability distribution of each logic state (e.g., L0-L7) based on pattern 700.

In some aspects, according to the logic state corresponding to each memory cell when the encoded original data is stored in the memory device, assigning a corresponding threshold voltage ($V_{th}$) to each memory cell can be based on a threshold voltage ($V_{th}$) distribution law for each logic state in the data pattern (e.g., pattern 700). For example, pattern 700 can include multiple individual threshold voltage ($V_{th}$) values for each type of logic state (e.g., L0-L7) to generate a statistical threshold voltage ($V_{th}$) probability distribution (e.g., percentage) of each type of logic state (e.g., L0-L7). In some aspects, a threshold voltage ($V_{th}$) can be randomly assigned to each memory cell in a particular logic state (e.g., L0-L7) under the condition that the threshold voltage ($V_{th}$) distribution law of that particular logic state is satisfied. In some aspects, the threshold voltage ($V_{th}$) distribution law can include a threshold voltage ($V_{th}$) distribution of a particular logic state that satisfies a statistical distribution (e.g., probability percentage).

In some aspects, verifying the soft decode capability of LDPC unit 112, 520 by utilizing the verifying data (e.g., generated threshold voltage ($V_{th}$) values 1020) can include generating soft read data by stimulating a soft read of the verifying data according to a soft read rule matching to LDPC unit 112, 520 to be verified. For example, as shown in FIGS. 5 and 11, soft data generation process 1100 can generate soft data 1150 based on threshold voltage ($V_{th}$) values 1130 and preset threshold voltage ($V_{th}$) offset 570. In some aspects, verifying the soft decode capability of LDPC unit 112, 520 by utilizing the verifying data (e.g., generated threshold voltage ($V_{th}$) values 1020) can include performing, based on the soft read data, soft decoding using LDPC unit 112, 520 to be verified. For example, as shown in FIGS. 5 and 11, soft data generation process 1100 can generate soft data 1150 and LDPC unit 520 can decode soft data 1150 via soft decode process 560.

In some aspects, the soft read rule matching to LDPC unit 112, 520 to be verified can include a setting rule of a read level offset. For example, as shown in FIG. 11, soft data 1150 (e.g., soft error injection value 1158) can be generated by soft decoding threshold voltage ($V_{th}$) values 1130 based on preset threshold voltage ($V_{th}$) offset 570 (e.g., first, second, and third preset threshold voltage ($V_{th}$) offsets 1152, 1154, 1156). In some aspects, according to the soft read rule of the LDPC unit to be verified, a plurality of read voltages can be set and the assigned threshold voltages ($V_{th}$) can be used as threshold voltages ($V_{th}$) of each memory cell to stimulate a read operation of the memory device. For example, as shown in FIG. 11, first, second, and third preset threshold voltage ($V_{th}$) offsets 1152, 1154, 1156 can be set (e.g., read voltage) to 3.5 V, 3.65 V, and 3.35 V, respectively, for lower page (LP) 1132 (e.g., $V_{offset}$=3.5 V), middle page (MP) 1134 (e.g., $V_{offset}$=3.65 V), and upper page (UP) 1136 (e.g., $V_{offset}$=3.35 V), respectively. In some aspects, the soft read data (e.g., soft data 1150) can include a plurality of read voltages and the corresponding read-out data. For example, as shown in FIG. 11, threshold voltage ($V_{th}$) value 1138 of 3.6 V for L4 [010] would be read as a 1 state for lower page (LP) 1132 (e.g., $V_{th}$=3.6 V>$V_{offset}$=3.5 V), a 0 state for middle page (MP) 1134 (e.g., $V_{th}$=3.6 V<$V_{offset}$=3.65 V), and a 1 state for upper page (UP) 1136 (e.g., $V_{th}$=3.6 V>$V_{offset}$=3.35 V), generating soft error injection value 1158 with [101].

In some aspects, LDPC soft decode verification method 500 can further include verifying a soft decode error correction capability of LDPC unit 112, 520 based on the decoded soft data and the original data. For example, memory controller 110 can compare (e.g., verify) encoded binary user data 610 to decoded soft data 1150 to verify a LDPC soft decode error correction capability (e.g., reliability) of LDPC unit 112, 520.

In some aspects, verifying the soft decode capability of LDPC unit 112, 520 by utilizing the verifying data (e.g., generated threshold voltage ($V_{th}$) values 1020) can include generating, based on the verifying data, soft data according to preset threshold voltage ($V_{th}$) offsets. For example, as shown in FIG. 11, soft data 1150 (e.g., soft error injection value 1158) can be generated by soft decoding threshold voltage ($V_{th}$) values 1130 based on preset threshold voltage ($V_{th}$) offset 570 (e.g., first, second, and third preset threshold voltage ($V_{th}$) offsets 1152, 1154, 1156).

In some aspects, verifying the soft decode capability of LDPC unit 112, 520 by utilizing the verifying data (e.g., generated threshold voltage ($V_{th}$) values 1020) can include decoding the soft data with LDPC unit 112, 520. For example, as shown in FIGS. 5 and 11, soft data generation process 1100 can generate soft data 1150 and LDPC unit 520 can decode soft data 1150 via soft decode process 560. In some aspects, verifying the soft decode capability of the LDPC unit by utilizing the verifying data can include verifying whether LDPC unit 112, 520 returns the encoded original data for each corresponding decoded soft data. For example, memory controller 110, a host, or external test equipment can compare (e.g., verify) encoded binary user data 610 to decoded soft data 1150 to verify a LDPC soft decode capability (e.g., reliability) of LDPC unit 112, 520.

In some aspects, LDPC soft decode verification method 500 can further include writing the encoded original data into a memory cache of the memory device. For example, as shown in FIG. 5, LDPC unit 520 can receive user data 510 (e.g., via memory controller 110) and encode user data 510 (e.g., write) to memory 530 (e.g., memory cache 162). In some aspects, LDPC soft decode verification method 500 can further include reading the encoded original data stored in the memory cache. For example, as shown in FIGS. 5 and 6, user data 510 can be read (raw) from memory 530 (e.g., memory cache 162) with memory controller 110 via raw user data process 600 (shown in FIG. 6). In some aspects, LDPC soft decode verification method 500 can further include writing the soft data into the memory cache of the memory device. For example, as shown in FIGS. 5 and 11, soft data generation process 1100 can generate soft data 1150, which can then be written (raw) to memory 530 (e.g., memory cache 162).

In some aspects, a system for verifying a low-density parity-check (LDPC) soft decode capability can include memory system 100 and a host coupled to the memory system 100. In some aspects, memory system 100 can include a memory device (e.g., NAND flash device 160) and memory controller 110 in which LDPC unit 112, 520 to be verified is provided. In some aspects, the system can be configured to receive original data corresponding to the memory device in which each memory cell is configured to store n-bit of data, wherein n is a whole number larger than 1. For example, as shown in FIGS. 1, 5, and 6, LDPC unit 520 can receive binary (original) user data 610 (e.g., user data 510) from NAND flash device 160, with lower page (LP) 610a, middle page (MP) 610b, and upper page (UP) 610c of pure binary data (e.g., only 0 or 1 states with no overlapping threshold voltage ($V_{th}$) data). In some aspects, user data 510 can be based on a triple-level cell (TLC) memory scheme (e.g., with n=3). For example, as shown in FIGS. 2 and 6, binary threshold ($V_{th}$) distribution 200 can include lower page (LP) 202a, middle page (MP) 202b, and upper page (UP) 202c for corresponding logic states L0-L7.

In some aspects, the system can be further configured to encode the original data by use of LDPC unit 112, 520. For example, as shown in FIG. 5, LDPC unit 520 can encode user data 510 (e.g., write) to memory 530 (e.g., in memory cache 162).

In some aspects, the system can be further configured to inject errors into the encoded original data (e.g., user data 610), by use of a data pattern (e.g., pattern 700) including the errors generated by threshold voltage ($V_{th}$) distributions interlaced between two neighboring logic states of $2^n$ logic states of the memory device (e.g., NAND flash device 160), for generating verifying data (e.g., generated threshold voltage ($V_{th}$) values 1020). For example, as shown in FIGS. 5-10, user data 510 can be read (raw) from memory 530 (e.g., from memory cache 162) via raw user data process 600 (shown in FIG. 6), raw user data 510 from raw user data process 600 can be mapped to pattern 700 (shown in FIG. 7) via mapping process 800 (shown in FIG. 8) to inject errors, and mapping process 800 (e.g., including mapping flow diagram 900 shown in FIG. 9) can generate threshold voltage ($V_{th}$) values 1020 for corresponding logic states (e.g., L0-L7) of raw user data 510 via threshold voltage ($V_{th}$) generation process 1000 (shown in FIG. 10).

In some aspects, the system can be further configured to verify a soft decode capability of LDPC unit 112, 520 by utilizing the verifying data (e.g., generated threshold voltage ($V_{th}$) values 1020). For example, as shown in FIGS. 5 and 11, soft data generation process 1100 (shown in FIG. 11) can generate soft data 1150 based on the combined generated threshold voltage ($V_{th}$) values 1020 and preset threshold voltage ($V_{th}$) offset 570, LDPC unit 520 can decode generated soft data 1150 from memory 530 (e.g., memory cache 162) via soft decode process 560, and memory controller 110 (or a host) can compare (e.g., verify) encoded user data 510 to corresponding decoded generated soft data 1150 from LDPC unit 520 to verify a LDPC soft decode capability of LDPC unit 520 (e.g., reliability percentage).

In some aspects, the system can be further configured to assign a threshold voltage ($V_{th}$) to the encoded original data according to the data pattern (e.g., pattern 700) for generating the verifying data (e.g., generated threshold voltage ($V_{th}$) values 1020). For example, as shown in FIG. 10, threshold voltage ($V_{th}$) generation process 1000 can assign threshold voltage ($V_{th}$) values 1020 for each corresponding logic state (e.g., L0-L7) of binary user data 610, with unknown threshold voltage ($V_{th}$) values 1010, based on a threshold voltage ($V_{th}$) probability distribution of each logic state (e.g., L0-L7) based on pattern 700.

In some aspects, the system can be further configured to generate soft read data by stimulating a soft read of the verifying data according to a soft read rule matching to LDPC unit 112, 520 to be verified. For example, as shown in FIGS. 5 and 11, soft data generation process 1100 can generate soft data 1150 based on threshold voltage ($V_{th}$) values 1130 and preset threshold voltage ($V_{th}$) offset 570. In some aspects, the system can be further configured to perform, based on the soft read data, soft decoding using LDPC unit 112, 520 to be verified. For example, as shown in FIGS. 5 and 11, soft data generation process 1100 can generate soft data 1150 and LDPC unit 520 can decode soft data 1150 via soft decode process 560.

In some aspects, the system can be further configured to verify a soft decode error correction capability of LDPC unit 112, 520 based on the decoded soft data and the original data. For example, memory controller 110 can compare (e.g., verify) encoded binary user data 610 to decoded soft data 1150 to verify a LDPC soft decode error correction capability (e.g., reliability) of LDPC unit 112, 520.

In some aspects, the system can be further configured to generate, based on the verifying data, soft data according to preset threshold voltage ($V_{th}$) offsets. For example, as shown in FIG. 11, soft data 1150 (e.g., soft error injection value 1158) can be generated by soft decoding threshold voltage ($V_{th}$) values 1130 based on preset threshold voltage ($V_{th}$) offset 570 (e.g., first, second, and third preset threshold voltage ($V_{th}$) offsets 1152, 1154, 1156).

In some aspects, the system can be further configured to decode the soft data with LDPC unit 112, 520. For example, as shown in FIGS. 5 and 11, soft data generation process 1100 can generate soft data 1150 and LDPC unit 520 can decode soft data 1150 via soft decode process 560. In some aspects, the system can be further configured to verify whether LDPC unit 112, 520 returns the encoded original data for each corresponding decoded soft data. For example, memory controller 110, a host, or external test equipment can compare (e.g., verify) encoded binary user data 610 to decoded soft data 1150 to verify a LDPC soft decode capability (e.g., reliability) of LDPC unit 112, 520.

In some aspects, the system can be further configured to write the encoded original data into a memory cache of the memory device. For example, as shown in FIG. 5, LDPC unit 520 can receive user data 510 (e.g., via memory controller 110) and encode user data 510 (e.g., write) to memory 530 (e.g., memory cache 162). In some aspects, the system can be further configured to read the encoded original data stored in the memory cache. For example, as shown in FIGS. 5 and 6, user data 510 can be read (raw) from memory 530 (e.g., memory cache 162) with memory controller 110 via raw user data process 600 (shown in FIG. 6). In some aspects, the system can be further configured to write the soft data into the memory cache of the memory device. For example, as shown in FIGS. 5 and 11, soft data generation process 1100 can generate soft data 1150, which can then be written (raw) to memory 530 (e.g., memory cache 162).

In some aspects, memory system 100 can include memory controller 110 and a memory device (e.g., NAND flash device 160) coupled to memory controller 110. In some aspects, memory controller 110 can include LDPC unit 112, 520 to be verified. In some aspects, the memory device can include memory cache 162. In some aspects, memory system 100 can be configured to receive original data corresponding to the memory device in which each memory cell is configured to store n-bit of data, wherein n is a whole number larger than 1. For example, as shown in FIGS. 1, 5, and 6, LDPC unit 520 can receive binary (original) user data 610 (e.g., user data 510) from NAND flash device 160, with lower page (LP) 610a, middle page (MP) 610b, and upper page (UP) 610c of pure binary data (e.g., only 0 or 1 states with no overlapping threshold voltage ($V_{th}$) data). In some aspects, user data 510 can be based on a triple-level cell (TLC) memory scheme (e.g., with n=3). For example, as shown in FIGS. 2 and 6, binary threshold ($V_{th}$) distribution 200 can include lower page (LP) 202a, middle page (MP) 202b, and upper page (UP) 202c for corresponding logic states L0-L7.

In some aspects, memory system 100 can be further configured to encode the original data by use of LDPC unit 112, 520. For example, as shown in FIG. 5, LDPC unit 520 can encode user data 510 (e.g., write) to memory 530 (e.g., in memory cache 162).

In some aspects, memory system 100 can be further configured to inject errors into the encoded original data (e.g., user data 610), by use of a data pattern (e.g., pattern 700) including the errors generated by threshold voltage ($V_{th}$) distributions interlaced between two neighboring logic states of $2^n$ logic states of the memory device (e.g., NAND flash device 160), for generating verifying data. For example, as shown in FIGS. 5-10, user data 510 can be read (raw) from memory 530 (e.g., from memory cache 162) via raw user data process 600 (shown in FIG. 6), raw user data 510 from raw user data process 600 can be mapped to pattern 700 (shown in FIG. 7) via mapping process 800 (shown in FIG. 8) to inject errors, and mapping process 800 (e.g., including mapping flow diagram 900 shown in FIG. 9) can generate threshold voltage ($V_{th}$) values 1020 for corresponding logic states (e.g., L0-L7) of raw user data 510 via threshold voltage ($V_{th}$) generation process 1000 (shown in FIG. 10).

In some aspects, memory system 100 can be further configured to verify a soft decode capability of LDPC unit 112, 520 by utilizing the verifying data (e.g., generated threshold voltage ($V_{th}$) values 1020). For example, as shown in FIGS. 5 and 11, soft data generation process 1100 (shown in FIG. 11) can generate soft data 1150 based on the combined generated threshold voltage ($V_{th}$) values 1020 and preset threshold voltage ($V_{th}$) offset 570, LDPC unit 520 can decode generated soft data 1150 from memory 530 (e.g., memory cache 162) via soft decode process 560, and memory controller 110 can compare (e.g., verify) encoded user data 510 to corresponding decoded generated soft data 1150 from LDPC unit 520 to verify a LDPC soft decode capability of LDPC unit 520 (e.g., reliability percentage).

In some aspects, memory system 100 can be further configured to generate, based on the verifying data, soft data according to preset threshold voltage ($V_{th}$) offsets. For example, as shown in FIG. 11, soft data 1150 (e.g., soft error injection value 1158) can be generated by soft decoding threshold voltage ($V_{th}$) values 1130 based on preset threshold voltage ($V_{th}$) offset 570 (e.g., first, second, and third preset threshold voltage ($V_{th}$) offsets 1152, 1154, 1156). In some aspects, memory controller 110 can be configured to decode the soft data with LDPC unit 112, 520. For example, as shown in FIGS. 5 and 11, soft data generation process 1100 can generate soft data 1150 and LDPC unit 520 can decode soft data 1150 via soft decode process 560. In some aspects, memory controller 110 can be further configured to verify whether LDPC unit 112, 520 returns the encoded original data for each corresponding decoded soft data. For example, memory controller 110 can compare (e.g., verify) encoded binary user data 610 to decoded soft data 1150 to verify a LDPC soft decode capability (e.g., reliability) of LDPC unit 112, 520.

It is to be understood that the phraseology or terminology herein is for the purpose of description and not of limitation, such that the terminology or phraseology of the present specification is to be interpreted by those skilled in relevant art(s) in light of the teachings herein.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A method for verifying a low-density parity-check (LDPC) unit capable of being applied in a memory system, the method comprising:

receiving original data corresponding to a memory device, provided in the memory system, in which each memory cell is configured to store n-bit of data, wherein n is a whole number larger than 1;

encoding the original data by the LDPC unit to be verified;

mapping the encoded original data with a data pattern indicating threshold voltage distributions of corresponding logic states to generate threshold voltage data for the encoded original data;

generating soft data based on the threshold voltage data for the encoded original data and preset threshold voltage offsets; and verifying a soft decode capability of the LDPC unit by utilizing the soft data.

2. The method of claim 1, further comprising injecting errors into the encoded original data, by a data pattern including the errors generated by the threshold voltage ($V_{th}$) distributions interlaced between two neighboring logic states of $2^n$ logic states of the memory device, for generating verifying data, wherein injecting errors into the encoded original data comprises assigning a threshold voltage ($V_{th}$) to the encoded original data according to the data pattern for generating the verifying data.

3. The method of claim 1, wherein verifying the soft decode capability of the LDPC unit by utilizing the soft data comprises:

generating soft read data by simulating a soft read of the soft data according to a soft read rule matching to the LDPC unit to be verified; and performing, based on the soft read data, soft decoding using the LDPC unit to be verified.

4. The method of claim 3, further comprising verifying a soft decode error correction capability of the LDPC unit based on the decoded soft data and the original data.

5. The method of claim 1, wherein verifying the soft decode capability of the LDPC unit by utilizing the soft data comprises:

decoding the soft data with the LDPC unit; and verifying whether the LDPC unit returns the encoded original data for each corresponding decoded soft data.

6. The method of claim 5, further comprising:

writing the encoded original data into a memory cache of the memory device;

reading the encoded original data stored in the memory cache; and writing the soft data into the memory cache of the memory device.

7. The method of claim 1, wherein the different test environments comprises different temperatures, different erase times, or a combination thereof.

8. The method of claim 1, wherein the data pattern is based on big data of the memory device, wherein the big data comprises statistical threshold voltage ($V_{th}$) probability distributions of each corresponding logic state.

9. The method of claim 1, wherein the data pattern is based on big data of one or more similarly manufactured memory devices, wherein the big data comprises statistical threshold voltage ($V_{th}$) probability distributions of each corresponding logic state.

10. The method of claim 9, wherein the big data is based on at least 1,000 similarly manufactured memory devices.

11. A system for verifying a low-density parity-check (LDPC) soft decode capability, the system comprising:

a memory system including a memory device and a memory controller in which an LDPC unit to be verified is provided; and a host coupled to the memory system, the system configured to:

receive original data corresponding to the memory device in which each memory cell is configured to store n-bit of data, wherein n is a whole number larger than 1;

encode the original data by use of the LDPC unit;

map the encoded original data with a data pattern indicating threshold voltage distributions of corresponding logic states to generate threshold voltage data for the encoded original data;

generate soft data based on the threshold voltage data for the encoded original data and preset threshold voltage offsets; and verify a soft decode capability of the LDPC unit by utilizing the soft data.

12. The system of claim 11, wherein the system is further configured to:

inject errors into the encoded original data, by a data pattern including the errors generated by the threshold voltage ($V_{th}$) distributions interlaced between two neighboring logic states of $2^n$ logic states of the memory device, for generating verifying data; and assign a threshold voltage (Vth) to the encoded original data according to the data pattern for generating the verifying data.

13. The system of claim 11, wherein the system is further configured to:

generate soft read data by simulating a soft read of the soft data according to a soft read rule matching to the LDPC unit to be verified; and perform, based on the soft read data, soft decoding using the LDPC unit to be verified.

14. The system of claim 13, wherein the system is further configured to verify a soft decode error correction capability of the LDPC unit based on the decoded soft data and the original data.

15. The system of claim 11, wherein the system is further configured to:

decode the soft data with the LDPC unit; and verify whether the LDPC unit returns the encoded original data for each corresponding decoded soft data.

16. The system of claim 15, wherein the system is further configured to:

write the encoded original data into a memory cache of the memory device;

read the encoded original data stored in the memory cache; and write the soft data into the memory cache of the memory device.

17. A memory system comprising:

a memory controller in which an LDPC unit to be verified is provided; and a memory device with a memory cache coupled to the memory controller, the memory system configured to:

receive original data corresponding to the memory device in which each memory cell is configured to store n-bit of data, wherein n is a whole number larger than 1;

encode the original data by use of the LDPC unit;

map the encoded original data with a data pattern indicating threshold voltage distributions of corresponding logic states to generate threshold voltage data for the encoded original data;

generate soft data based on the threshold voltage data for the encoded original data and preset threshold voltage offsets; and verify a soft decode capability of the LDPC unit by utilizing the soft data.

18. The memory system of claim 17, wherein the memory controller is configured to decode the soft data with the LDPC unit and verify whether the LDPC unit returns the encoded original data for each corresponding decoded soft data.

19. The memory system of claim 17, wherein the memory device is configured to store the soft data into the memory cache.

\* \* \* \* \*